(12) United States Patent
Usui et al.

(10) Patent No.: US 6,252,261 B1
(45) Date of Patent: Jun. 26, 2001

(54) GAN CRYSTAL FILM, A GROUP III ELEMENT NITRIDE SEMICONDUCTOR WAFER AND A MANUFACTURING PROCESS THEREFOR

(75) Inventors: Akira Usui; Akira Sakai; Haruo Sunakawa; Masashi Mizuta; Yoshishige Matsumoto, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/342,003

(22) Filed: Jun. 28, 1999

(30) Foreign Application Priority Data

Sep. 30, 1998 (JP) .................................................. 10-291354
Mar. 26, 1999 (JP) .................................................. 11-122816

(51) Int. Cl.[7] ................. H01L 31/0328; H01L 31/0336; H01L 31/072
(52) U.S. Cl. ............................. 257/190; 257/76; 257/615
(58) Field of Search ................................. 257/76, 81, 94, 257/99, 103, 190, 615; 438/94, 93, 718

(56) References Cited

U.S. PATENT DOCUMENTS

| | | | |
|---|---|---|---|
| 5,432,808 | * | 7/1995 | Hatano et al. . |
| 5,766,783 | * | 6/1998 | Utsumi et al. . |
| 5,787,104 | * | 7/1998 | Kamiyama et al. . |
| 5,880,485 | * | 3/1999 | Marx et al. . |
| 5,903,017 | * | 5/1999 | Itaya et al. . |
| 6,030,849 | * | 2/2000 | Hasegawa et al. . |
| 6,045,611 | * | 4/2000 | Ishii et al. . |
| 6,051,849 | | 4/2000 | Davis et al. . |
| 6,069,394 | * | 5/2000 | Hashimoto et al. . |

FOREIGN PATENT DOCUMENTS

| | | |
|---|---|---|
| 4-84418 | 3/1992 | (JP) . |
| 4-127521 | 4/1992 | (JP) . |
| 6-105797 | 12/1994 | (JP) . |
| 8-64791 | 3/1996 | (JP) . |
| 8-222812 | 8/1996 | (JP) . |
| 10-215035 | 8/1998 | (JP) . |
| 11-135770 | 5/1999 | (JP) . |

OTHER PUBLICATIONS

Nihon kessyouseityou gakkaisi, 25 (2) 99, Jun. 30, 1998.
Tanpatyouhikaridevice dai–162 iinkai dai–12 kenkyuukai siryou, pp. 7–12, Nihon gakujyutu sinkoukai, Jul. 3, 1998.
Sunakawa, Haruo et al, Extended Abstracts of the 17th Electronic Materials Symposium, EMS '98, "Defect Structure in GaN Films Formed by Epitaxial Lateral Overgrowth", pp. 231–234, Jul. 8–10, 1998.
Sakai, Akira et al., *Applied Physics Letters*, "Defect Structure in Selectivity Grown GaN Films with Low Threading Dislocation Density", 71 (16) Oct. 20, 1997, American Institute of Physics, pp. 2259–2261.
Sakai, Akira et al., *Applied Physics Letters*, "Transmission electron microscopy of defects in GaN films formed by epitaxial lateral overgrowth", vol. 73, No. 4, Jul. 27, 1998, pp. 481–483.

* cited by examiner

*Primary Examiner*—Sheila V. Clark
(74) *Attorney, Agent, or Firm*—Hutchins, Wheeler & Dittmar

(57) ABSTRACT

A GaN crystal film having a mask patterned in a stripe for forming multiple growing areas on a sapphire substrate and coalesced GaN crystals covering the mask dividing the areas, grown from the neighboring growing areas, comprising defects where multiple dislocations along with the stripe are substantially aligned with the normal line of the substrate, in the crystal areas over the mask, and dislocations propagating in substantially parallel with the substrate surface while, in the vicinity of the areas where the crystals are coalesced over the mask, propagating substantially in the normal line of the substrate surface, and a manufacturing process therefor. According to this invention, there can be provided a GaN crystal film in which strain, defects and dislocations are reduced and which tends not to generate cracks.

61 Claims, 15 Drawing Sheets

GAN CRYSTAL FILM, A GROUP III ELEMENT NITRIDE SEMICONDUCTOR WAFER AND A MANUFACTURING PROCESS THEREFOR

BACKGROUND OF THE INVENTION

1. Field of the Invention

This invention relates to a GaN crystal film formed by epitaxial growth on a sapphire substrate, and a semiconductor device fabricated using the GaN film. This invention also relates to a group III element nitride semiconductor wafer formed by epitaxial growth on a heterogeneous-material substrate (referred to as a "hetero-substrate"), a semiconductor device fabricated using the group III element nitride semiconductor wafer and a manufacturing process therefor.

2. Description of the Related Art

GaN has a large forbidden bandgap of 3.4 eV and is a direct-transition type of compound semiconductor, and thus has been attractive as a blue-light emitting device material.

A material for a substrate in fabricating a light-emitting device using the GaN material is preferably a bulk crystal of the same material as an epitaxial layer to be grown, i.e., a bulk crystal of GaN. It is, however, difficult to form a bulk crystal of GaN due to a higher dissociation pressure of nitrogen; that is, it is very difficult to fabricate a GaN-bulk crystal substrate. Therefore, a sapphire ($Al_2O_3$) substrate having a relatively close lattice constant to GaN has been used, on which GaN is epitaxially grown. Thus, a material whose physical properties such as a lattice constant and coefficient of thermal expansion as well as chemical properties are quite different from those of an epitaxial layer has been used for a substrate.

It has been described in Jpn. J. Appl. Phys. Vol.32 (1993), pp.1528–1533 that epitaxial growth on such a hetero-substrate may cause strain or defects and, if growing a thick film, cracks. In such a case, there has been often caused a device with an extremely poor performance or a shattered growth layer.

J. Mater. Res. Vol.11 (1996), pp.580–592 has described a correlation between a dislocation structure in a GaN film grown on a sapphire substrate and its crystal quality.

It has described that (a) a GaN film on a sapphire substrate is formed via mutual coalescence of island crystal grains c-axis oriented in parallel with the normal line of the substrate surface, (b) during it growing, individual crystals rotate by a small angle centering the c axis, to form dislocations in an interface between crystal grains, (c) these dislocations cause threading dislocations having a displacement vector parallel to the c plane of the GaN crystal.

Presence of such threading dislocations in the GaN crystal film means that the GaN crystal film has a domain form divided by original crystal grains, and a crystal orientation component parallel to the c plane of the GaN crystal film have different structure for each domain. It may reflect that the GaN crystal film forms a mosaic structure, which means that the density of the dislocations having a displacement vector parallel to the c plane must be minimized as much as possible for improving the crystal quality.

To solve the problems, JP-A 8-64791 has disclosed a process for epitaxial growth of a lattice mismatch system wherein dislocations generated due to lattice mismatch between a substrate and an epitaxial growth layer are concentrated to a particular area. It has described that the process may minimize a dislocation density in a desired region, which makes it possible to fabricate a semiconductor light-emitting device for an application such as a semiconductor laser requiring a high quality crystallinity. Specifically, an amorphous GaN film is formed on a sapphire substrate in the first crystal growth, the film is etched into a stripe, and a GaN film is epitaxially grown on the amorphous GaN film and the substrate in the second crystal growth. In another example, an $SiO_2$ film in place of the amorphous GaN film is formed in a stripe and an epitaxial layer is grown only on the substrate.

Such a process, however, forms an amorphous region on a surface, so that a homogenous growth layer cannot be formed over all the surface or there is generated a region where no growth occurs on an $SiO_2$ area, so that a flat growth layer cannot be formed over all the surface. Thus, there are limitations for an area on which a device is to be formed.

In addition, a substrate material such as sapphire, silicon carbide and $MgAl_2O_4$ has different lattice constant, crystal structure and coefficient of thermal expansion from those in a GaN epitaxial growth film, which gives a serious problem of curving in an epitaxially formed wafer. For example, when a sapphire substrate is used, significant curving may be generated as schematically shown in FIG. 14. A substrate with a diameter of 1 inch may be curved in a level that its center is convex by several millimeters with respect to its periphery; the radius of curvature may be below 70 cm.

The problem of curving cannot be improved very much even when a different type of substrate material is used or a mixed crystal such as AlGaN and InGaN or a group III element nitride semiconductor such as AlN and InN was epitaxially grown in place of GaN. Therefore, epitaxial growing of GaN on a sapphire substrate will be described.

If there is a significant curvature of a wafer, it may cause, for example, difficulty in applying a lithography technique to a later device formation. When there is a considerable curvature, a wafer should be divided at least prior to applying lithography in a manufacturing process. For example, the wafer should be divided into areas of about 5 $mm^2$ before applying lithography to form a window for a stripe laser for electric current injection.

A blue-light-emitting optical device is one of applications of a group III element nitride semiconductor having a wurtzite crystal structure. In particular, there is much prospect that the semiconductor may realize a digital video disk (DVD) using a blue laser as a light source which enables data to be written or read out in a high density. A Fabry-Perot resonator of such a semiconductor laser is generally formed by cleavage. It may be, for example, assumed that a GaN epitaxial layer is formed on a sapphire substrate, on which there is, then, epitaxially formed a double-hetero (DH) structure for a laser with a group III element nitride semiconductor where a group III element is nitrogen, to form a stripe structure, solving the above problem in lithography. Other components such as an electrode may be formed in subsequent steps, and finally a Fabry-Perot resonator should be formed generally by cleavage.

However, when there is a significant mismatch between the cleavage planes of the GaN epitaxial layer and the sapphire substrate, it may be quite difficult to obtain a clear cleavage in the presence of the sapphire substrate. Thus, before cleavage, it may be necessary to remove the sapphire substrate by, for example, grinding. In other words, due to the problem for lithography, there is added a complicated process that the sapphire on the rear face of the wafer divided into small areas is ground.

Furthermore, even if it is possible to conduct cleavage leaving the sapphire substrate, there may remain the sapphire substrate 101, an insulating material, on the rear face, and therefore, an electrode cannot be formed on the rear face. Thus, there may be added a process that an electrode 102 is formed on a partial area excavated from the surface of the DH structure (an electrode-forming layer 106). That is, the electrode 102 instead of a rear electrode should be formed as shown in FIG. 15(*a*) (a conceptual cross section of a laser structure viewing from the cross-section of the Fabry-Perot resonator, where 104 is a silicon oxide film and 105 is a laser emission region). On the other hand, if the sapphire substrate 101 is removed, the electrode 102 can be disposed on the rear face, facing the surface electrode 103 as shown in FIG. 15(*b*).

Furthermore, the problem of curving due to a thick dissimilar material substrate such as sapphire on a wafer, may occur when epitaxially growing, for example, a DH structure on the wafer. Specifically, a significantly curved wafer may not be easily placed in a holder and may cause a temperature difference within the wafer surface during epitaxial growth because the holder cannot be in contact with the whole surface of the wafer.

SUMMARY OF THE INVENTION

An object of this invention is to provide a GaN crystal film and a group III element nitride semiconductor wafer with reduced strain, defects, dislocations and cracks even with a large thickness, even when it is formed by epitaxial growth on a hetero-substrate with different lattice constant and coefficient of thermal expansion, as well as a manufacturing process therefor.

Another object of this invention is to provide a semiconductor device having excellent properties by forming a semiconductor device structure on a group III element nitride semiconductor wafer formed by epitaxial growth, in particular a GaN crystal film.

This invention provides a GaN crystal film having a mask patterned in a stripe for forming multiple growing areas on a sapphire substrate and coalesced GaN crystals covering the mask dividing the areas, grown from the neighboring growing areas, comprising defects in the crystal areas over the mask, where multiple dislocations along with the stripe are substantially aligned with the normal line of the substrate and dislocations propagating in substantially parallel with the substrate surface while, in the vicinity of the areas where the crystals are coalesced over the mask, propagating substantially in the normal line of the substrate surface.

This invention also provides the above GaN crystal film where the above dislocations propagating substantially in the normal line of the substrate surface have a displacement vector tilted with respect to the c plane of the GaN crystal and the above dislocations propagating substantially in the stripe direction have a displacement vector parallel to the c plane of the GaN crystal.

This invention also provides the above GaN crystal film where in comparison with the layer region formed during an initial stage of the crystal growth, the upper layer has a lower ratio of the density of the dislocations having a displacement vector parallel to the c plane of the GaN crystal to the density of the dislocations having a displacement vector tilted from the c plane of the GaN crystal.

This invention also provides the GaN crystal film where the above defects are formed in the vicinity of both edges in the stripe direction on the mask and of the areas where the crystals are coalesced over the mask.

This invention also provides a GaN crystal film where at least 50% of the dislocations in the GaN crystal film have a displacement vector tilted from the c plane of the GaN crystal.

This invention also provides a GaN crystal film where less than 50% of the dislocations in the GaN crystal film have a displacement vector parallel to the c plane of the GaN crystal.

This invention also provides a GaN crystal film where at least 50% of the dislocations in the GaN crystal film have a displacement vector tilted from the c plane of the GaN crystal, while less than 50% of the dislocations in the GaN crystal film have a displacement vector parallel to the c plane of the GaN crystal.

This invention also provides a group III element nitride semiconductor wafer comprising a layer region where at least 50% of dislocations in the same layer region are those having a displacement vector tilted from the c plane of a wurtzite crystal structure.

This invention also provides a group III element nitride semiconductor wafer comprising a layer region where less than 50% of dislocations in the same layer region are those having a displacement vector parallel to the c plane of a wurtzite crystal structure.

This invention also provides a group III element nitride semiconductor wafer comprising a layer region where at least 50% of dislocations in the same layer region are those having a displacement vector tilted from the c plane of a wurtzite crystal structure while less than 50% of dislocations in the same layer region are those having a displacement vector parallel to the c plane.

This invention also provides a group III element nitride semiconductor wafer comprising a layer region where at least 60% of dislocations in the same layer region are those having a displacement vector tilted from the c plane of a wurtzite crystal structure.

This invention also provides a group III element nitride semiconductor wafer comprising a layer region where less than 40% of dislocations in the same layer region are those having a displacement vector parallel to the c plane of a wurtzite crystal structure.

This invention also provides a group III element nitride semiconductor wafer comprising a layer region where at least 60% of dislocations in the same layer region are those having a displacement vector tilted from the c plane of a wurtzite crystal structure while less than 40% of dislocations in the same layer region are those having a displacement vector parallel to the c plane.

This invention also provides a group III element nitride semiconductor wafer comprising a layer region where at least 70% of dislocations in the same layer region are those having a displacement vector tilted from the c plane of a wurtzite crystal structure.

This invention also provides a group III element nitride semiconductor wafer comprising a layer region where less than 30% of dislocations in the same layer region are those having a displacement vector parallel to the c plane of a wurtzite crystal structure.

This invention also provides a group III element nitride semiconductor wafer comprising a layer region where at least 70% of dislocations in the same layer region are those having a displacement vector tilted from the c plane of a wurtzite crystal structure while less than 30% of dislocations in the same layer region are those having a displacement vector parallel to the c plane.

This invention provides the group III element nitride semiconductor wafer where the crystal film having the layer region is formed on a hetero-substrate and is a crystal film having a mask patterned in a stripe for forming multiple growing areas on the hetero-substrate and coalesced crystals covering the mask dividing the areas, grown from the neighboring growing areas.

This invention also provide a process for manufacturing a group III element nitride semiconductor wafer, comprising forming a mask patterned in a stripe for forming multiple growing areas on a hetero-substrate made of a material different from crystals to be grown; cleaning the surface of the mask; growing crystals from the growing areas while forming facet structures to cover the mask by the crystals grown from the neighboring growing areas divided by the mask; and epitaxially growing crystals to embed the facet structures for flattening the surface.

This invention can provide a group III element nitride semiconductor wafer such as a GaN crystal film with improved properties, by minimizing cracks in an epitaxial layer due to differences of a coefficient of thermal expansion and a lattice constant between a group III element nitride semiconductor such as a GaN crystal and a hetero-substrate; a dislocation density; and defects due to dislocation. A high-quality semiconductor device such as a laser structure and a transistor structure whose properties are substantially improved can be fabricated on the group III element nitride semiconductor wafer such as a GaN crystal film according to this invention.

DETAILED DESCRIPTION OF THE PREFERRED EMBODIMENTS

Figure 1A:
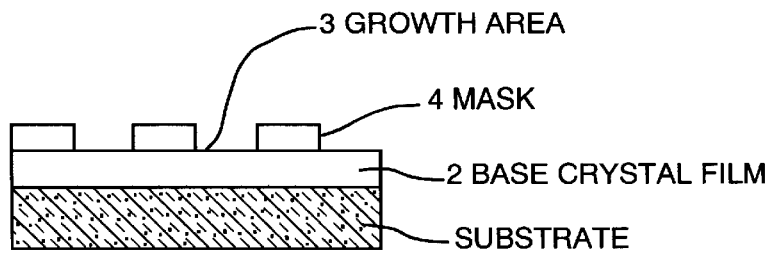
FIG. 1 is a schematic process cross section for illustrating a manufacturing process for a GaN crystal film according to this invention.

Process for Growing a GaN Crystal Film

An embodiment of a process for growing a GaN crystal film of this invention will be described with reference to the drawings.

On a sapphire substrate 1 is grown a base crystal film 2 containing GaN, on which a stripe patterned mask 4 is formed by photolithography and wet etching to form growing areas (FIG. 1(*a*)).

The mask 4 may be directly formed on the substrate 1, but the base crystal film 2 may be formed to reduce a dislocation density to some degree in advance. It is preferable to form the base crystal film 2 because a dislocation structure in a GaN crystal film 5 to be formed later can be effectively controlled. Preferable materials for the base crystal film include group III element nitrides such as GaN, AlN, $Al_xGa_{1-x}N$ (0<x<1), $In_xGa_{1-x}N$ (0<x<1). It is not always necessary that the base crystal film has the same composition as that of an epitaxial layer formed on the film; specifically it may not always be made of a group III element nitride. It is, however, preferable to select the same crystal system as that of the epitaxial layer, having a wurtzite crystal structure. Such a base crystal film preferably has a thickness of 0.5 $\mu$m to 20 $\mu$m. If the thickness is less than the lower limit, the base crystal film does not effectively work, while if higher than the upper limit, cracks tend to be generated.

It is preferable that such a base crystal film has a multiple-layer structure consisting of a low-temperature buffer layer and then a high-temperature growth layer from the substrate. The low-temperature buffer layer is an almost amorphous crystal layer grown at a relatively lower temperature of about 400–600° C., by which crystal nuclei may be formed at a higher density. The film thickness may be preferably as thin as about 0.01 to 0.1 $\mu$m. The high-temperature growth layer is a high quality layer grown at a relatively higher temperature of about 950–1000° C.

Conditions for forming the base crystal film will be described in terms of an embodiment. The base crystal film may be formed by metalorganic chemical vapor deposition (MOCVD). An MOCVD apparatus for depositing the base crystal film is a kind of low-pressure reactor and may be a generally used MOCVD apparatus.

The low-temperature buffer layer was formed by placing a sapphire substrate on an MOCVD apparatus and heating it for several to 30 min while maintaining a substrate temperature at 900 to 1100° C. at a reduced pressure of up to several tens Torr in a stream of hydrogen. The process was conducted for cleaning the substrate. A higher hydrogen pressure is, therefore, preferable and may be higher than 1 atm. It was conducted at a reduced pressure because of mechanical restrictions.

Then, the substrate was cooled to 400 to 600° C. and trimethylgallium (TMG) and ammonia ($NH_3$) were introduced into the apparatus to form a GaN low-temperature buffer layer with a thickness of 0.01 $\mu$m to 0.05 $\mu$m. The optimal range of the thickness of the low-temperature buffer layer was determined from the experimental results obtained by the present inventors on effects to a crystallization process during raising a temperature in growing a high-temperature growth GaN layer on the buffer layer. Therefore, if the base crystal film is made of a material other than GaN or if a different warming process or atmosphere is employed during forming the high-temperature growth layer on the buffer layer, the optimal range of the thickness of the low-temperature buffer layer may vary.

A molar ratio of a group V element N source ($NH_3$) to a group III element Ga source (TMG) supplied during growing the low-temperature buffer layer (V/III ratio) is preferably 10000 to 30000. TMG was supplied into the CVD apparatus while bubbling hydrogen and/or nitrogen as a carrier gas into a TMG liquid at several hundreds ml/min, and $NH_3$ was supplied, maintaining the above V/III ratio. To the CVD apparatus, nitrogen and/or hydrogen as a carrier gas was, as necessary, introduced in addition to the feed gas, maintaining the total pressure at 30 to 700 Torr. The carrier gas may be an inert gas such as argon and helium instead of nitrogen. It has been observed that hydrogen as a carrier gas is associated with crystallinity of the low-temperature buffer layer, its partial pressure may be preferably about $1/10$ to $1/3$ of the total pressure.

The conditions for growing the low-temperature buffer layer are relatively mild as described above, and a high-temperature growth layer is formed on its top layer. Thus, the base crystal film is formed in a multistep process.

Typical conditions for forming a low-temperature buffer layer will be described. A sapphire substrate was cleaned in a hydrogen atmosphere at a reduced pressure of 100 Torr at 1000° C. for 10 min. The substrate was cooled to 450 to 500° C., and then crystal growing was conducted by supplying ammonia and TMG at a V/III ratio of 20000, hydrogen as a carrier gas in a 1.2-fold amount of ammonia and nitrogen as a carrier gas in a 2.6-fold amount of ammonia. The thickness of the low-temperature buffer layer was adjusted to 0.015 $\mu$m to 0.04 $\mu$m.

When the substrate is made of SiC, the cleaning process may be conducted at 800° C. and when being made of $MgAl_2O_4$, the process may be conducted below the temperature for a sapphire substrate. A temperature and a time for cleaning of the substrate may be selected as appropriate, depending on the material of the substrate. Such a cleaning process of a substrate is not essential, but it is preferable to conduct the process. Such a cleaning process of a substrate may improve reproductivity of crystallinity of the high-temperature growth layer formed on a low-temperature buffer layer. Instead of this cleaning, a modified surface-treatment technique conducted before loading a base substrate in a buffer-layer forming apparatus might be comparably effective.

For forming a base crystal film, a base crystal film consisting of GaN has been described, but it may consist of a mixed crystal of GaN as a main component and other elements such as Al, In and B. It is preferable that the base crystal film consists of or essentially consist of GaN, but a variety of materials may be incorporated.

A base crystal film formed by the above multistep growth process may further reduce dislocations generated from an interface of a substrate, so that dislocations in a crystal region over a mask may be more effectively controlled. On a substrate may be formed only a low-temperature buffer layer, on which a mask may be then formed, or a mask may be directly formed on a substrate and then a low-temperature buffer layer may be formed only on growth areas.

A mask 14 preferably has a stripe shape, and has a thickness of 0.01 to 5 $\mu$m. The mask is preferably made of, but not limited to, $SiO_2$ and may be an insulator film such as $SiN_x$.

The width of the mask 14 is preferably 0.2 $\mu$m to 2 mm. The mask may be extended to effectively block dislocations threading from a lower crystal although a too wide mask may lead to a significantly large film thickness required for flattening a growth layer and to tendency to abnormal growth on the mask or curving of a film. Thus, the thickness is preferably below 2 mm. On the other hand, a too narrow width may lead to insufficient control of dislocations threading from a lower crystal as well as to insufficient facet structures to control dislocations. Thus, it may be difficult to provide a GaN crystal film having a characteristic dislocation form of this invention. The width of the mask is more preferably 0.5 $\mu$m to 1 mm, further preferably 1 $\mu$m to 500 $\mu$m.

A width of a growth area 3 (opening) is preferably in a range of 0.01 to 100 $\mu$m, more preferably 0.5 to 100 $\mu$m, further preferably 1 to 10 $\mu$m. If it is too wide, threading dislocations may increase and facet structures may be insufficiently formed to control dislocations. As a result, it may be difficult to provide a GaN crystal film having a characteristic dislocation form of this invention. Assuming A is the mask width and B is the width of the growth area, a ratio of B/(A+B) is preferably 0.000005 to 1, more preferably 0.0005 to 1, further preferably 0.002 to 0.9.

A direction of the mask stripe is preferably within 30 degrees from <11–20> direction or <1–100> direction perpendicular to the <11–20> direction, more preferably <11–20> or <1–100> direction. In particular, the direction is preferably <11–20> or <1–100> direction in HVPE and <11–20> direction in MOVPE.

Then, a GaN crystal is epitaxially grown on the growth areas. A substrate having a mask 4 is inserted into a reaction tube of an epitaxial apparatus, and then heated to a predetermined growth temperature while supplying a mixed gas of hydrogen and nitrogen and an N-source gas. After the temperature becomes stable, a Ga source is supplied to grow GaN crystal layers on growth areas 3. The crystals may be preferably by hydride VPE (vapor phase epitaxy), i.e., VPE based on a chloride transport process using gallium chloride (GaCl) as a Ga source and ammonia ($NH_3$) gas as an N source, but MOVPE (metalorganic vapor phase epitaxy) using an organometallic compound as a Ga source may be employed.

Figure 1B:
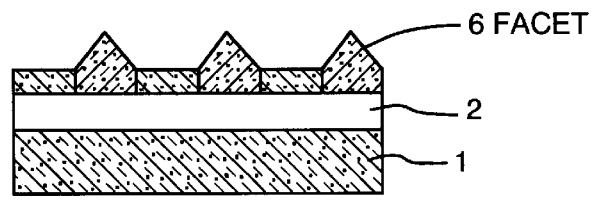

In an early stage, a GaN crystal does not grow on the mask 4, but only on the growth areas 3, and thus GaN crystals on the growing areas form facets 6 having an orientation different from that of the substrate (FIG. 1(b)). Preferably such facets may be formed by adjusting conditions for growing GaN crystals; a growth temperature of 650° C. to 1100° C. and the amount of the N source from 1- to 1000-fold of that of the Ga source.

Figure 1C:
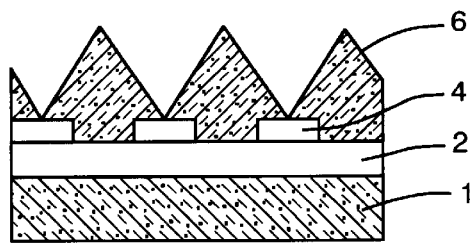

By further continuing the epitaxial growth, GaN crystals grow to directions perpendicular to the facet planes, to cover not only the growth areas but also the mask 4, and finally GaN-crystal facets on neighboring growth areas become in contact with each other (FIG. 1(c)).

Figure 1D:
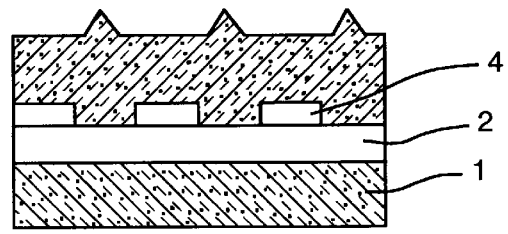
Figure 1E:
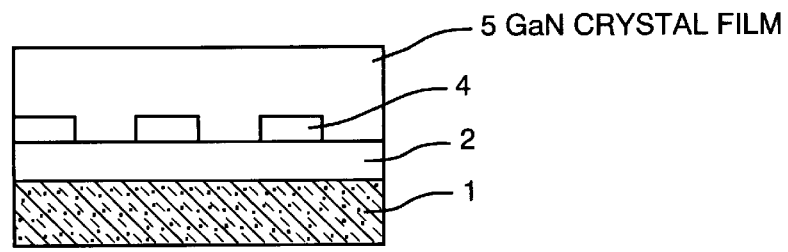

By further continuing the epitaxial growth, the facets may be embedded (FIG. 1(d)), to finally provide a GaN crystal film 5 with a flat surface (FIG. 1(e)).

In general, when growing a GaN crystal on a sapphire substrate, dislocations associated with crystal defects generated in an interface with the substrate extend to directions perpendicular to the interface. Thus, even if the epitaxial film is thicker, dislocations may not be reduced.

In a growing process of this invention, selective growth leads to facet structures on growth areas. Such facets are generated because crystals grow more slowly than on the other surfaces. The facets thus formed allow dislocations to proceed toward them, so that dislocations extending to a direction perpendicular to the substrate can extend no longer to the direction. Specifically, the dislocations change their directions as the facets grow, most of which then reach a crystal end or form a closed loop. As a result, as the thickness of the epitaxial film increases, crystal defects are reduced in the upper growth areas. Thus, defects may be reduced within the epitaxial film. Growing crystals forming facet structures as described above may allow crystal defects to be significantly reduced.

In particular, since a GaN crystal grows rapidly in vapor phase epitaxy based on chloride transportation using a chloride as a Ga source, the same planes as the substrate plane disappear more quickly in the facet structures. Therefore, dislocations extending to a direction perpendicular to the substrate earlier extend to a direction of a plane in a facet structure different from the substrate plane, leading to significant reduction of dislocations extending to a direction perpendicular to the substrate (threading dislocation) in a GaN crystal.

Metalorganic vapor phase epitaxy using an organometallic compound as a Ga source exhibits a slower growth rate than a vapor phase epitaxy based on chloride transportation, but it may be compensated by making the same planes in a GaN facet structure as the substrate plane quickly disappearing as described above. For example, increase of the mask area with regard to the growth areas may increase supplies of growth materials from the top of the mask, to accelerate growth of GaN crystals in the growth areas.

Epitaxial growth of GaN has been described, but similar effects may be obtained by epitaxially growing an InGaN, AlGaN or InN film, and even when the growing crystal film is doped.

As described above, in a GaN crystal film provided according to this embodiment, crystal defects are significantly reduced, which may lead to a significant reduction in crystal defects in a device structure such as a semiconductor laser formed on the GaN crystal film (layered structure comprising a GaN crystal film). Thus, it may improve crystallinity of a layered structure fabricated on a hetero-substrate, e.g., a sapphire substrate, and provide a semiconductor device such as a semiconductor laser exhibiting excellent properties.

Furthermore, a GaN crystal film with a small number of crystal defects may be fabricated by growing a GaN crystal film with a desired thickness and then removing at least the hetero-substrate such as a sapphire substrate, preferably the hetero-substrate and a mask and a part of the GaN crystal film, and then the film may be used as a substrate to provide various advantages in forming a device such as a semiconductor laser.

For example, using a GaN crystal film substrate for fabricating a semiconductor light-emitting device may allow an electrode to be formed on the rear face of the substrate, which has been a problem when using an insulating hetero-substrate such as a sapphire substrate.

Furthermore, when a semiconductor light-emitting device fabricated on a substrate consisting of a GaN crystal film (GaN crystal film substrate) is a semiconductor laser comprising a GaN crystal film, the GaN crystal film substrate and the layered structure of the semiconductor laser have the same cleavage plane, which may allow a resonator mirror to be fabricated by cleavage.

The advantages of fabricating a device using a GaN crystal film substrate have been described. However, it is, of course, possible to form an electrode on the rear face of the substrate or a resonator mirror by cleavage, by forming a GaN crystal film with a desired thickness by the above selective growth technique on a hetero-substrate such as a sapphire substrate, then fabricating a semiconductor device structure in sequence and then removing the hetero-substrate.

The GaN crystal film may be formed on the hetero-substrate such as a sapphire, with a thickness of preferably 20 $\mu$m to 1 mm, more preferably 80 $\mu$m–500 $\mu$m.

A device structure may be formed on a GaN crystal film, using not only the crystal-growing side of the GaN crystal film, but also the side of the GaN crystal film where the hetero-substrate has been removed, i.e., the dissimilar-substrate side of the GaN crystal film. In such a case, the thickness of the GaN crystal film removed together with the hetero-substrate is preferably up to 300 $\mu$m, more preferably 5 to 150 $\mu$m.

Such a GaN crystal film may be used as a device substrate to improve crystallinity of a layered structure of a semiconductor device formed and thus, to provide a semiconductor device with excellent properties.

It may be applied to a semiconductor light-emitting device to allow an electrode to be formed on the rear face of the substrate, which has been a problem when using a sapphire substrate.

Furthermore, when a semiconductor light-emitting device is a semiconductor laser, a resonator mirror may be fabricated by cleavage even for a laser structure fabricated on a hetero-substrate having a cleavage plane different from that of the GaN crystal film.

Figure 2:
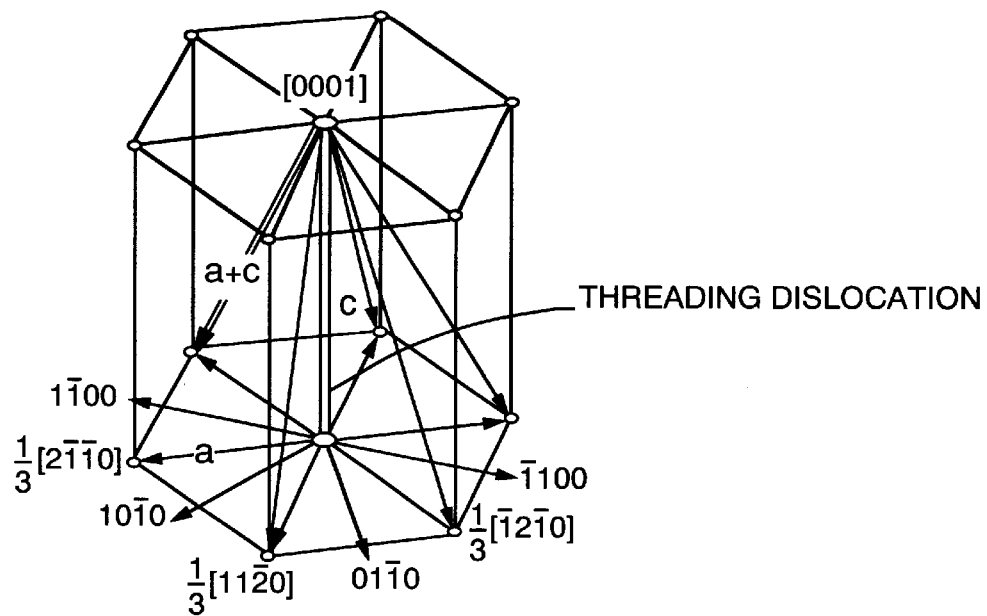
FIG. 2 illustrates a basic structure of a dislocation in a GaN crystal.

The crystal structure for the GaN crystal film formed according to the above process will be described in detail.
Basic Structure of a Dislocation For clear understanding this invention, a basic structure of a dislocation in the GaN crystal will be described. The GaN crystal consists of hexagonal unit lattices, and the relationship between indexes indicating individual orientations and the dislocation structure in the crystal is shown in FIG. 2. It is generally known that there are three kinds of vectors, <11–20>/3, <0001> and <11–23>/3 as a Burgers vector b, which is a displacement vector between atoms generated by dislocation, in a crystal having a hexagonal structure.

There are six <11–20>/3 vectors in the light of plus and minus signs in a vector equivalent to the a axis vector parallel to the c plane of the hexagonal lattice shown in FIG. 2, two <0001> vectors equivalent to the c axis and 12 <11–23>/3 vectors which are tilted to the c plane and are equivalent to the edge a+c of the hexagonal pyramid.

One Burgers vector b is certainly defined to a single dislocation, and the direction of the Burgers vector b is never changed even when the direction of the dislocation line is changed.

The designation of "edge" or "screw" indicating a character of a dislocation indicate that a Burgers vector b runs in perpendicular or parallel to the direction of the dislocation line, respectively. A dislocation where edge and screw characters are mixed, i.e., the Burgers vector b is tilted to the dislocation line, is called a "mixed" dislocation.

According to this rule, a dislocation running along the [0001] direction of the hexagonal lattice, i.e., the c-axis direction, may be defined as an edge dislocation when Burgers vector b=<11–20>/3, a screw dislocation when Burgers vector b=<0001> and a mixed dislocation when Burgers vector b=<11–23>/3.

A dislocation should be carefully designated when a direction of a dislocation line varies with respect to that of a Burgers vector b in a single dislocation. A dislocation does not always run straight as shown in FIG. 2, and rather it often change its direction. Considering an extreme example that a dislocation line is circular, a part running parallel to the Burgers vector b is a screw dislocation while a part running perpendicular to the Burgers vector b is an edge dislocation. Thus, a single dislocation has multiple designations. A bent dislocation may be more precisely defined by a direction of a Burgers vector b. In particular, dislocations in the GaN crystal film of this invention have a bent form as described later, and thus a dislocation may be herein defined depending on a direction of a Burgers vector b, as appropriate.

Generally, a GaN crystal film on a sapphire substrate grows along the c axis of a hexagonal lattice, and a dislocation within the film generally runs along the c axis. In other words, the dislocation line threads the film. Such a dislocation is called a "threading dislocation", which means a dislocation different from those called with the above designations, i.e., a dislocation threading a film in its thickness direction.

Determination of a Dislocation Character

Determination of a dislocation character in this invention will be described. A dislocation is herein observed mainly with a transmission electron microscope (TEM).

Generally, a dislocation is observed with a TEM by tilting a TEM sample to an incident electron beam, by which a preferentially excited diffraction beam is extracted by an objective aperture to form an image. It corresponds to diffraction of an incident electron beam by a particular crystal lattice plane in the TEM sample. A dislocation contrast in the TEM image observed by the technique is generated because diffraction conditions for an electron beam by a lattice plane are locally different in the vicinity of the dislocation. Specifically, since the lattice plane in the vicinity of the dislocation is locally curved with respect to the other regions, Bragg reflection conditions for an electron beam in an area with a dislocation are different from those in an area without a dislocation, leading to a contrast in the TEM image corresponding to the shape of the dislocation line.

Figure 3:
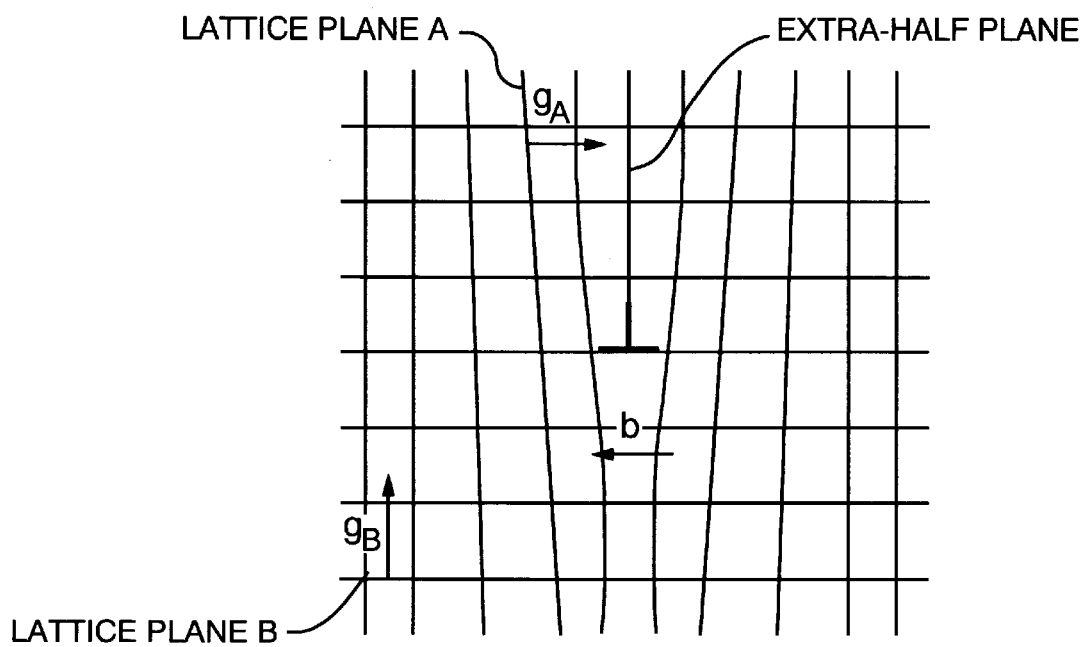
FIG. 3 schematically shows a status in crystal planes around a dislocation.

Although an actual GaN crystal structure has a hexagonal lattice, the above principle will be herein described using a crystal structure having a simple cubic lattice. FIG. 3 schematically shows a lattice plane around a dislocation in a simple cubic lattice crystal. In this figure, there is an edge dislocation running perpendicular to the paper surface (the area indicated by ⊥), which has a Burgers vector b in the shown direction.

It should be noted in this figure that the lattice plane A having a normal vector $g_A$ in a direction parallel to the Burgers vector b is locally curved around the dislocation due to its presence, while the lattice plane B having a normal vector $g_B$ in a direction perpendicular to the Burgers vector b is not curved even around the dislocation line.

Then, when forming a TEM image using the lattice plane A, a contrast for the dislocation line appears because the above Bragg reflection conditions are different between an area near the dislocation line and the other areas. On the other hand, when forming a TEM image using a lattice plane B, a contrast for the dislocation line does not appear because there are no curvatures in the lattice plane due to the dislocation line.

In other words, when a normal vector g of a diffraction grating plane (referred to as a "diffraction vector") selected in TEM observation is perpendicular to the Burgers vector b of the dislocation line, i.e., when the scalar product of these vectors is zero (the diffraction vector g×the Burgers vector b=0), a dislocation contrast disappears.

Thus, the principle may be utilized to determine an unknown dislocation character (edge, screw or mixed).

Assuming that a dislocation character in FIG. 3 is unknown, a method for determining a dislocation character will be described. Since the crystal structure shown in this figure is a simple cubic lattice, the Burgers vector of the dislocation has a direction to the lattice plane A, the lattice plane B or the paper surface.

First, TEM observation is initiated using an arbitrary lattice plane. For example, an electron beam may be diffracted by the lattice plane A (diffraction vector $g_A$) to give a contrast in a TEM image for determining the form of the dislocation in the TEM sample, i.e., the direction of the dislocation line to the crystal. For the case shown in this figure, it may be indicated that the dislocation line is parallel to the surface normal line of the TEM sample (the incidence direction of the electron beam). It can be said that observing the dislocation under the observation conditions means that the Burgers vector b has not a direction perpendicular to the lattice plane B or to the paper surface.

Then, TEM observation is conducted using another lattice plane B (diffraction vector $g_B$) for the same visual field. The contrast disappears. Thus, it can be unequivocally determined that the Burgers vector b of the dislocation has a direction perpendicular to the diffraction vector $g_B$. As a result, the direction of the Burgers vector b shown in the figure may be determined.

Finally, since the Burgers vector b is herein in perpendicular to the dislocation line, it may be found that the dislocation is an edge dislocation.

Although the above example is an edge dislocation in the simplest lattice, i.e., a simple cubic lattice, the principle may be similarly applied to any kind of dislocation present in a hexagonal lattice as shown in FIG. 2 or other crystal lattices. Thus, the method has been established as a determination method for a dislocation character present in a GaN crystal.

A Dislocation Structure for a GaN Crystal Film of this Invention

Based on the results from, for example, TEM observation for the GaN crystal film prepared according to the above process, the dislocation structure for the GaN crystal film of this invention will be described.

Taking only the base crystal film into account, there was observed a dark threading contrast running in a perpendicular direction, i.e., threading dislocations, in a TEM cross-sectional photograph from a stripe direction. After determining individual dislocation characters, it was found that more than 70% of the dislocations were edge dislocations and most of the others were mixed dislocations, and screw dislocations are very little.

Taking the GaN crystal layer grown from the growth areas of the mask openings into account, it was found that most of the dislocations took over threading dislocations from the base crystal layer and no new defects were observed in the interface between these layers. The dislocations taken over had a bending shape. In particular, it was observed that bending dislocations were piled up in the vicinity of the mask, covering it. It was found that the dislocations were bent within the thickness of about 5 $\mu$m of the upper GaN crystal layer.

The same visual field in a part of the cross section was observed by TEM using four types of diffraction vectors g, and then it was observed that a dislocation contrast was found or not as the diffraction vector g was altered. The observation results indicated dislocations taking over the edge dislocations of the base crystal layer whose Burgers vector b was <11–20>/3 and those taking over mixed dislocations of the base crystal layer whose Burgers vector b was <11–23>/3.

Comparing the statuses and the structures between these dislocations, it was observed that the former dislocations were bent relatively at random regardless of the position of the mask while the latter dislocations were prominent in the vicinity of the mask.

By observing the former dislocations by stereomiography and TEM from a direction perpendicular to the film surface, it was found that a flat part to the substrate after bending was tilt by about 30 degrees from the TEM sample face (corresponding to the TEM photograph plane) and was parallel to the Burgers vector b in the dislocation. In other words, the former dislocations were provided by the process that dislocations having an edge character in the base crystal layer were taken over by the upper GaN crystal layer and then were bent in the crystal layer to be altered into a screw character. It might be expected that a majority of the dislocations did not thread the GaN crystal layer because the edge dislocations dominating at least 70% of those in the base crystal layer were almost always bent according to such a mechanism.

On the other hand, it was found from TEM observation that the latter dislocations were mixed dislocations, and that parts parallel to the substrate by bending were no longer on a slip plane not as were for the former dislocations, but were aligned with the [1–100] direction parallel to the TEM sample plane. Such latter dislocations were bent at a facet.

Thus, it can be concluded that dislocations which were mixed dislocations in the base crystal layer were taken over by the upper GaN crystal layer, were bent at a facet and then propagated to a direction parallel to the substrate as the facet grew.

Figure 4:
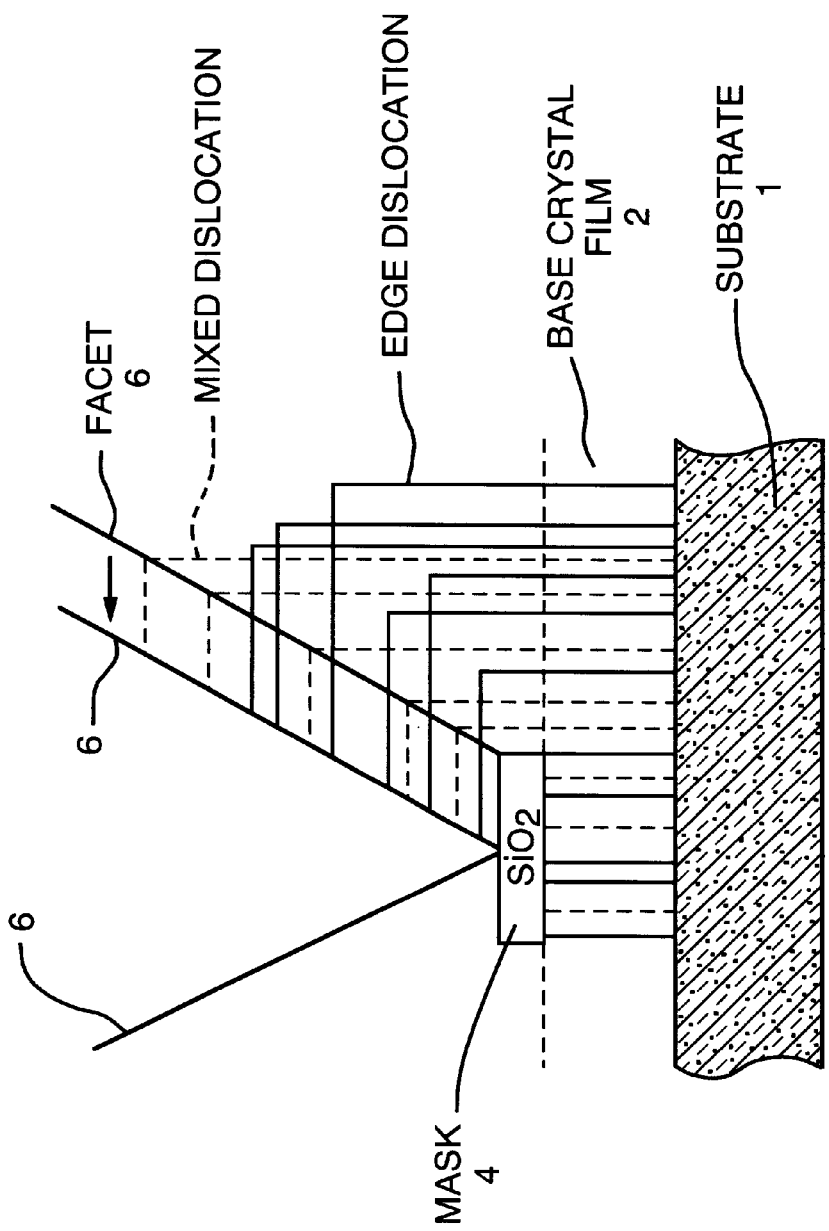
FIG. 4 schematically shows a dislocation structure in a GaN crystal film according to this invention.

The dislocation structure as described above is shown in FIG. 4.

A dislocation structure and a crystal structure over the mask will be described in detail.

Figure 5:
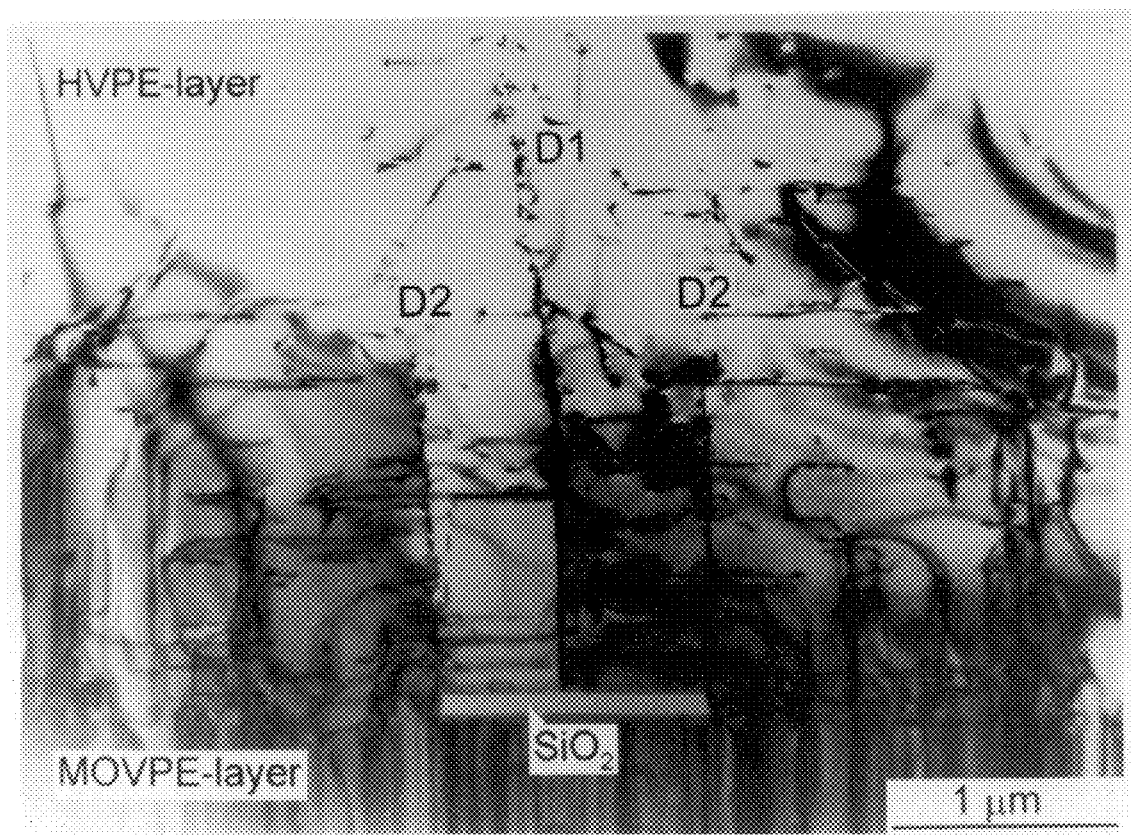
FIG. 5 is a TEM photograph (a photograph substituting for a drawing) of a film cross section showing a defect structure in an area over a mask in a GaN crystal film according to this invention.

FIG. 5 is a TEM photograph for a cross section showing a defect structure in an area over the mask in the GaN crystal film 5. The stripe of the mask is aligned with the [11–20] direction of the GaN crystal, and the TEM image was obtained by observing it from its stripe direction. It should be noted that there are defects extending from the center and the edge of the mask in the [0001] direction as indicated by D1 and D2. These defects were also observed for a GaN crystal whose mask direction is [1–100].

Figure 6A:
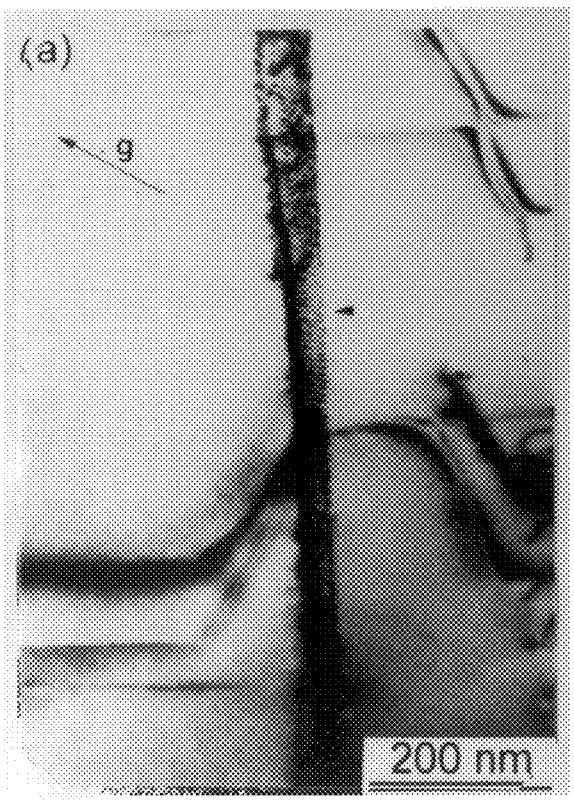
FIG. 6 is another TEM photograph (a photograph substituting for a drawing) of a film cross section showing a defect structure in an area over a mask in a GaN crystal film according to this invention.

FIGS. 6(a) and (b) are TEM images obtained by enlarging the D1 defect area to observe it for the different diffusion vectors g, respectively, showing that the D1 defect consists of two kinds of dislocation groups. One is a dislocation element running in perpendicular to the TEM sample surface (paper surface) and piled up along the [0001] direction, whose contrast disappears for the diffraction vector g in FIG. 6(b). These indicate that the dislocation group runs along the [11–20] direction and are aligned to the [0001] direction, having a Burgers vector b perpendicular to the [0001] direction. The other dislocation group consist of dislocations running along the [0001] direction as typically observed in FIG. 6(b).

Figure 7A:
FIG. 7 shows a defect structure in a GaN crystal film according to this invention (a photograph substituting for a drawing).
Figure 7B:
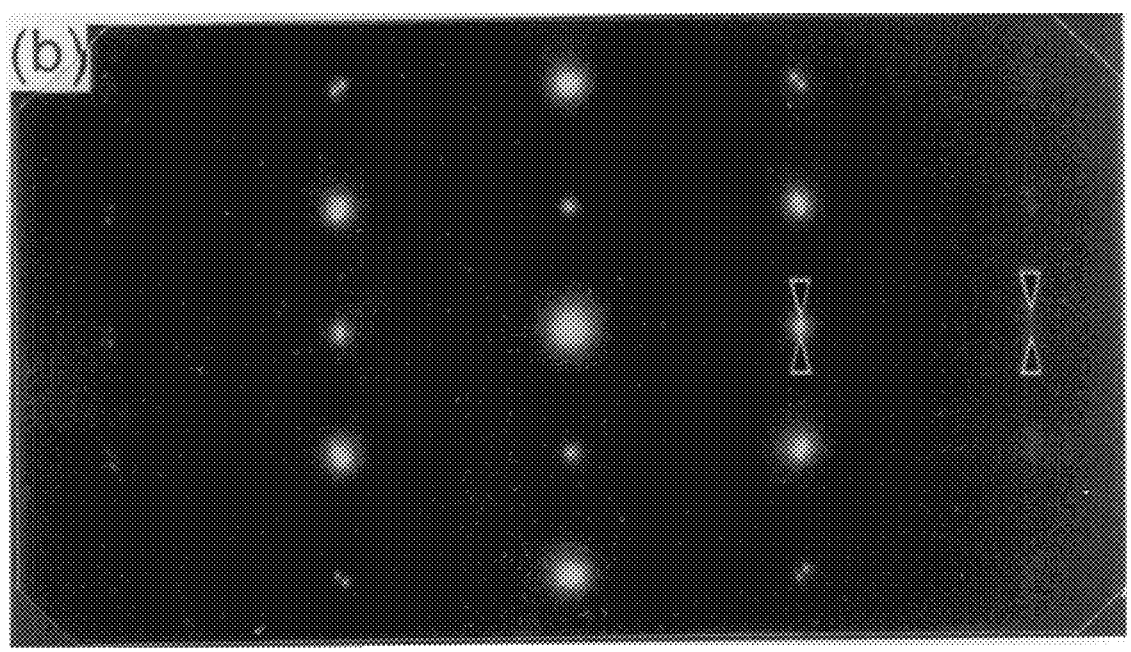

First, the former dislocation group will be analyzed in detailed. FIGS. 7(a) and (b) are a high resolution TEM image and a corresponding transmission electron beam diffraction image, respectively, viewing a D1 defect from the [11–20] direction. In FIG. 7(a), it can be seen that sectional dislocations are periodically aligned in the [0001] direction as is in FIG. 6(a). It has been seen that the crystals are oriented in a pattern shown in the insert figure in FIG. 7(a), by carefully observing the tilt of the lattice stripe of the crystals in both sides of the alignment plane (the arrowhead in the figure indicates the c axis of the crystal and the tilt is exaggerated). In the diffraction image in FIG. 7(b), split diffraction spots can be seen and that a higher-order diffraction site has a wider split spacing. It can be concluded from these results that D1 defects have properties of a tilt boundary having its rotation axis in the [11–20] direction.

Figure 7C:
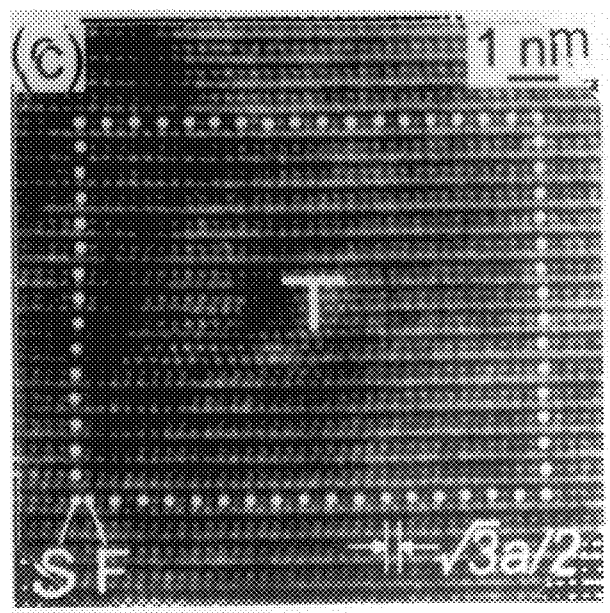

The Burgers vector b for the dislocation group forming the tilt boundary was directly determined a method shown in FIG. 7(c). When there is a dislocation in a crystal, drawing a circuit (Burgers circuit) including the dislocation with a primitive period may allow the Burgers vector b for the dislocation to be detected. FIG. 7(c) shows the result obtained by drawing the Burgers circuit in a manner that the lengths are equal between the top and the bottom edges or the right and the left edges; for example, originating from S, left→top→right→bottom of the dislocation core. There can be observed a shift between the end point F and the origin S due to the dislocation. The Burgers vector b for the dislocation is a vector having an absolute value of $3^{1/2}a/2$ from the origin S to the end point F where a is the a-axis vector of the GaN hexagonal lattice which corresponds to the <11–20>/3. It should be, however, noted that the Burgers vector b thus obtained is a projection of the true Burgers vector b for the dislocation to the [11–20] direction. For most of the dislocations forming the tilt boundary, such an individual analysis was conducted, and then it has been found that the tilt boundary is composed of one set of dislocations.

For this dislocation structure, it should be noted that the extra-half-plane is below the dislocation line. As seen in FIG. 2, an extra lattice plane is always formed due to a dislocation. A dislocation is often indicated by a symbol "T". Herein, there is an extra-half-plane below the dislocation core like a vertical bar in "T". Since there is such an extra-half-plane below each dislocation, i.e., there are the same number of such planes as that of the dislocations in the tilt boundary, crystals in both sides of the tilt boundary is tilted as shown in the insert figure in FIG. 7(a).

A D2 defect was observed as described above. Then, it was found that the D2 defect was a tilt boundary like the D1 defect, except that periodic array spacings for individual dislocations are as 2 to 4 times large as those (about 7 nm) for the D1 defect and the Burgers vector b for the dislocation has the same absolute value, but an opposite sign in relation to the D1 defect. Specifically, since there is an extra-half-plane above the dislocation line for the D2 defect, the c-axes for the crystals in both sides of the tilt boundary are tilt away from the boundary, rather than in FIG. 7(a).

Figure 8:
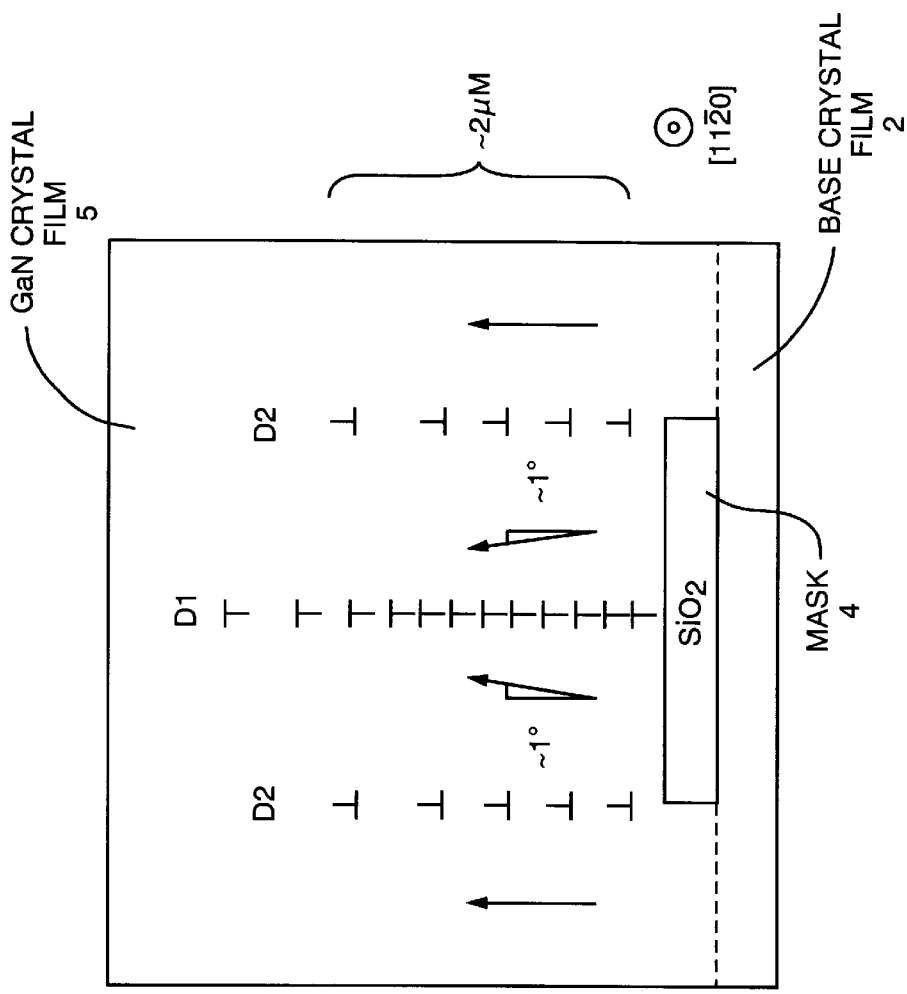
FIG. 8 schematically shows a defect structure in a GaN crystal film according to this invention.

Comprehensively considering the results, the defect structure above the mask can be simply and schematically shown as in FIG. 8. Specifically, both D1 and D2 defects are tilt boundaries. Since the dislocations forming these defects have the Burgers vectors b having the same absolute value but the opposite sign each other, the c axis in the area above the mask is tilt in relation to that of the area above the opening (growth area 3). An average tilt angle for the c axis in the area above the mask by about 2 μm was estimated to be about 1 degree from the transmission electron diffraction image. In a higher area in the film, a spacing for an individual dislocation is larger. D1 and D2 defects were not observed in areas over the mask by equal to or more than about 5 μm and 2 μm, respectively. As a spacing for a dislocation in the boundary increases, the tilt angle is reduced. The tilt angle for the c axis over the mask is, therefore, are reduced, and finally becomes zero.

The source and the structure for dislocations forming D1 and D2 defects will be described. As described above, there are mainly two types of dislocations in a GaN crystal film. One is a dislocation taking over an edge dislocation in the base crystal film and bent to a direction parallel to the substrate (hereinafter, referred to as a "Type-A dislocation") and the other is a dislocation taking over a mixed dislocation in the base crystal film and similarly bent to a direction parallel to the substrate (hereinafter, referred to as a "Type-B dislocation"). It should be noted that the Burgers vector b for the Type-A dislocation is equivalent to an a-axis vector of a hexagonal lattice in <11–20>/3. As described above, a Burgers vector b for a dislocation forming a tilt boundary has an absolute value of $3^{1/2}a/2$, which may be probably the projection value of the Burgers vector b equivalent to the a-axis vector through the [11–20] direction. A dislocation in the tilt boundary forming a D1 or D2 defect may be originated from Type-A dislocation. There may be exposed flat parts of bent Type-A dislocations in the facet surface before the crystals grown from the openings in the mask are coalesced, and then after coalescence of the crystals, the dislocations may be embedded into the crystals to form the D1 and D2 defects.

Figure 6B:
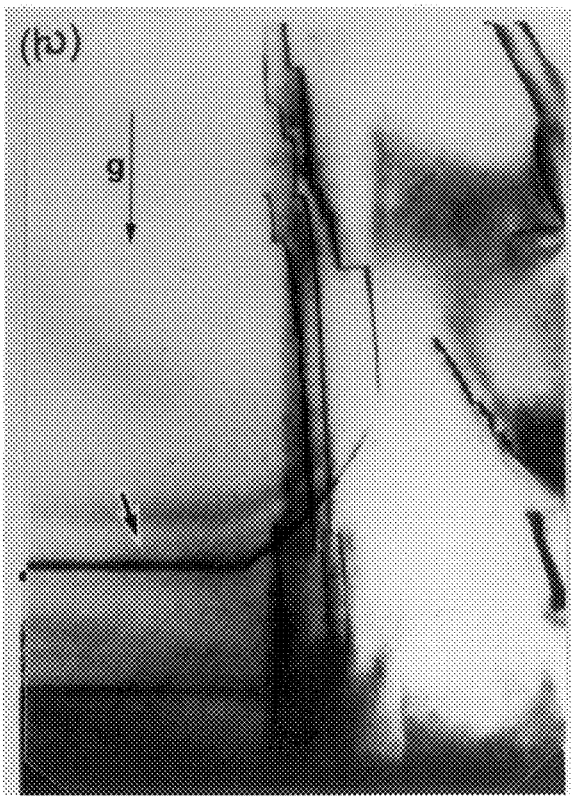

Another dislocation group included in the D1 defect seen in FIG. 6(b) will be described. According to TEM analysis, it was found that these dislocations are those whose Burgers vector b is a <11–23>/3 type. In addition, bent dislocations as indicated by the arrowhead were often observed in FIG. 6(b). Such a configuration may suggest that these dislocations originate from Type-B dislocations; specifically, Type-B dislocations propagated to a lateral direction during growing a facet in the GaN crystal might again propagate to a longitudinal direction. Theoretically, dislocations forming a tilt boundary as described above are present on a plane parallel to the surface of the GaN crystal film, and therefore does not increase a threading dislocation density. However, re-propagation of the Type-B dislocations to a longitudinal direction may increase a threading dislocation density over the mask in relation to that over the opening. It may, as a result, cause residualthreading dislocations in the GaN crystal film.

Variation in a Film Thickness and a Dislocation Density

Variation in a film thickness and a dislocation density will be described.

As described above, Type-A dislocations are bent to a lateral direction in a GaN crystal layer to form a tilt boundary in an area over a mask. Since the tilt boundary comprises a set of dislocations running in parallel to the film surface, it can be said that the bent Type-A dislocations are parallel until they finally reach an end of the crystal. Specifically, there are no Type-A dislocations over the length of the tilt boundary, i.e., over 5 μm from the interface between the base crystal layer 2 and the GaN crystal layer 5 in this determination sample. Furthermore, the Type-A dislocations are first bent to a lateral direction over the opening of the mask before a facet is formed to complete growing a GaN crystal whose cross section is triangular (See FIG. 4). A density for Type-A dislocations may be sharply reduced in an area whose film thickness is over the height of the facet triangle whose size depends on the opening width.

On the other hand, Type-B dislocations are bent at the facet plane 6 to a lateral direction to propagate toward the center of the mask, and then are again bent to a longitudinal direction to propagate above. These dislocations, as a rule, take over the dislocation density from the opening.

Figure 17:
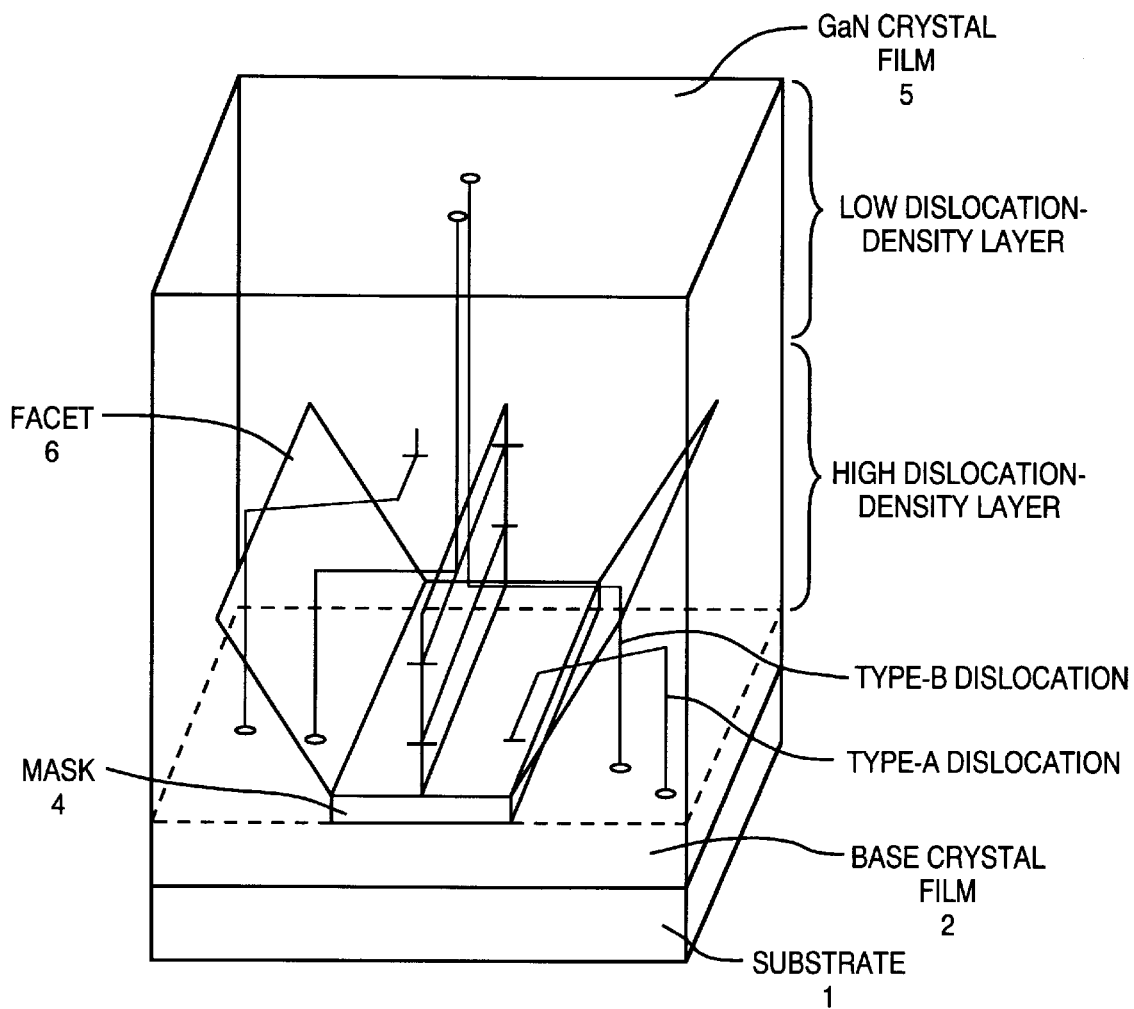
FIG. 17 schematically illustrates a dislocation structure in a GaN crystal film according to this invention.

Considering the above results, a dislocation structure for a GaN crystal film formed according to this invention is schematically shown in FIG. 17. In this figure, a typical dislocation structure is illustrated, where there are mainly Type-A dislocations having a displacement vector parallel to the c plane and Type-B dislocations having a displacement vector tilted from the c plane. In this figure, each dislocation running along the stripe direction in the center of the mask is drawn as if it exists alone, but there are dislocations connected with Type-A dislocation bent to the stripe direction at the edge of the mask, depending on growing conditions such as a mask shape described below.

There will be described variation in a dislocation density on a film surface depending on a film thickness due to a dislocation structure.

A ratio of the number of each type of dislocation to the total dislocation number varies in a GaN crystal film according to this invention as follows; because of the above dislocation structure as shown in FIG. 17, in the upper region (a low dislocation-density layer), Type-A dislocations having a displacement vector parallel to the c plate, i.e., those which were edge dislocations in the base crystal layer, were reduced, while Type-B dislocations having a displacement vector tilted from the c plane, i.e., those which are mixed dislocations in the base crystal layer 2 are taken over by the upper layer as they are, resulting that in relation to the total dislocation number, the ratio of Type-A dislocation is reduced while that of Type-B dislocation is increased.

In this case, there was found by determining dislocation characters in the GaN crystal film by the above TEM observation that in a GaN crystal film directly grown on a sapphire substrate by a conventionally common process, a rate of Type-B dislocation was below 30% while there are provided areas where at least 50% of the total dislocations are Type-B dislocations by varying a mask width, an opening width, a proportion of the opening width to the mask period and a stripe direction of the mask.

Figure 9:
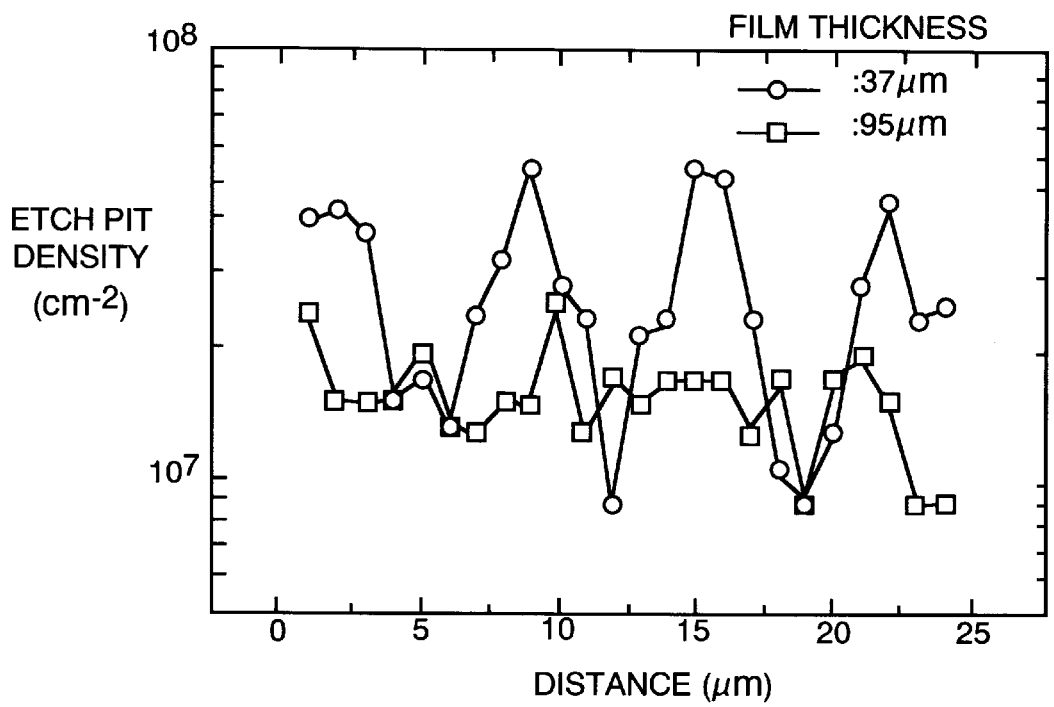
FIG. 9 is a plot of etch pit densities detected on a GaN crystal film surface to a distance perpendicular to a stripe direction.

Next, for variation in the overall dislocation density, there will be described a dislocation distribution reflecting a propagation course the above mixed dislocations which may be observed immediately after the film surface becomes flat. FIG. 9 is a graph showing results obtained by detecting dislocations exposed on the film surface by an etch pit technique, where the ordinate and the abscissa indicate an etch pit density and a distance in a direction perpendicular to the stripe direction, respectively, and where there are shown results for two types of GaN crystal films whose are different in thickness from each other. At the level of 37 μm thickness when the film surface becomes flat, there can be observed increase or decrease of dislocation densities corresponding to the period of the mask stripe. Such a periodic distribution gradually disappears as the film thickness increases, and finally cannot be observed at a film thickness over 95 μm.

Figure 10:
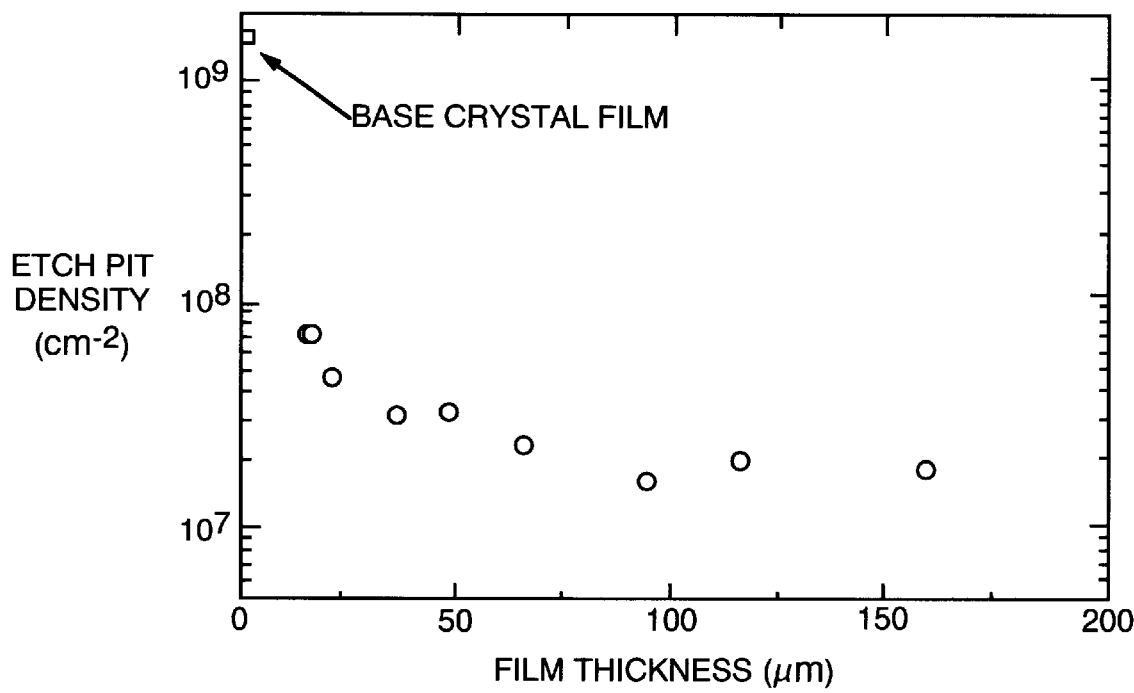
FIG. 10 is a plot of overall etch pit densities detected on a GaN crystal film surface to a film thickness.

FIG. 10 is a graph in which an overall etch-pit density detected on the GaN crystal film surface is plotted to a film thickness. In the graph, sharp reduction in a dislocation density at a film thickness below 30 μm occurred because Type-A dislocations propagated to a lateral direction by the above mechanism to run out of the crystal. On the other hand, it can be seen that the remaining dislocations are gradually reduced as the film thickness increases.

It can be understood from the above dislocation structure that a dislocation density and a dislocation character within the base crystal film may significantly influence the final overall dislocation density in the crystal, in particular the overall dislocation density in the upper layer region. For example, if mixed dislocations having a displacement vector tilted from the c plane, Type-B dislocations, in the buffer layer can be reduced, or if the ratio of the mixed dislocations can be reduced even if the overall dislocation density cannot be reduced in the buffer layer, it may be finally possible to provide a GaN crystal whose overall dislocation density is lower. For reducing the mixed dislocations, it is desirable to select growing conditions so that island growth of hexagonal GaN initially occurs during growing a GaN crystal on a hetero-substrate crystal. It is more preferable to grow a crystal in which the surface of the island crystal is atomically flat to form no atomic steps. Effective growing conditions may include adequately nitriding the surface of the hetero-substrate crystal before growing the GaN crystal and minimizing a tilt angle from a low index plane such as (0001) as an orientation of the surface of the substrate crystal as much as possible.

Determination of a Dislocation Density

There are mainly two methods for determining a dislocation density. One is a method that dislocations in a crystal is directly observed by a transmission electron microscope to determine the number. For threading dislocations in an epitaxial film as described above, cross-sectional or plane observation may be employed. For determining a dislocation density, a plane observation is preferable in the light of its precision, and it is necessary to observe as large area as possible.

The other is a method that an area where threading dislocations are exposed in the film surface is selectively etched with a chemical solution and resulting concaves (etch pits) are counted with an optical microscope or a scanning electron microscope. In this method, since a larger area can be counted compared with the above transmission electron microscope technique, a statistically reliable value can be obtained. However, it should be assured that one etch pit corresponds to a single threading dislocation. Therefore, a chemical solution should be appropriately selected in advance and etching conditions for forming etch pits should be precisely determined.

Fabrication of a GaN Semiconductor Device

An embodiment for fabrication of a GaN semiconductor device will be described with reference to FIG. 11. In this embodiment, a GaN semiconductor device is fabricated on a GaN crystal film formed as described above; in particular fabrication of a GaN semiconductor light-emitting device.

Figure 11A:
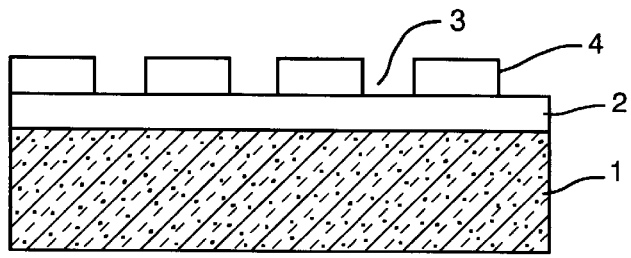
FIG. 11 is a process cross section schematically illustrating a process for fabricating a GaN semiconductor laser structure on a GaN crystal film according to this invention.
Figure 11B:
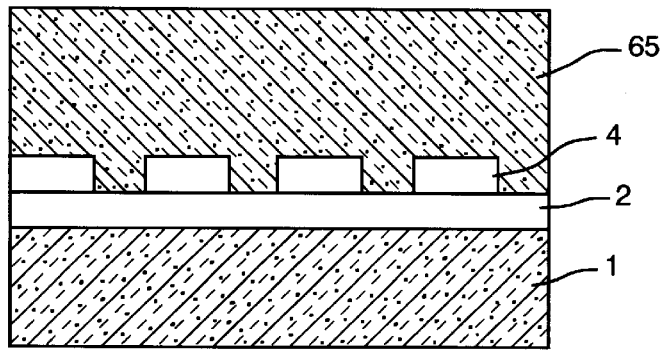
Figure 11C:
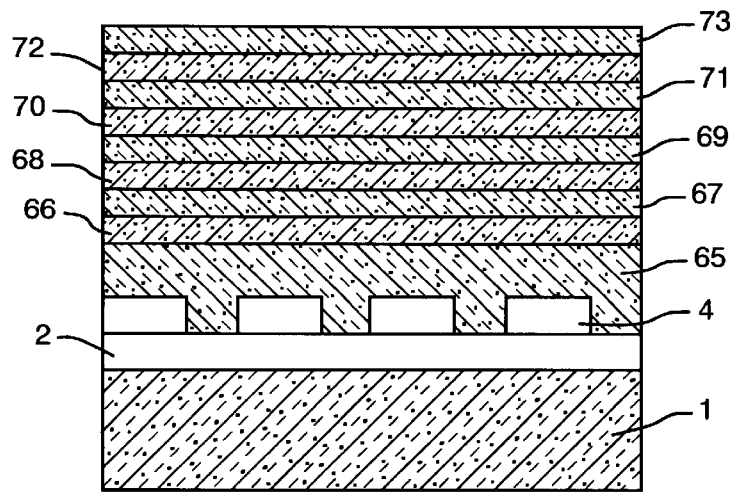
Figure 11D:
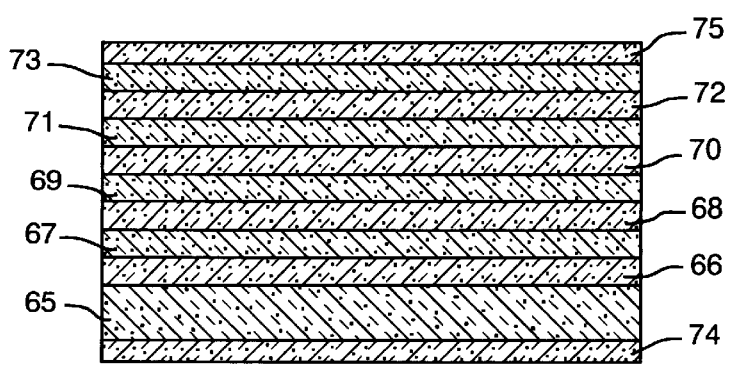

First, on a substrate 1 is formed an n-type GaN crystal film 65 according to the above method for growing a GaN crystal film (FIGS. 11(a) and (b)).

Then, a device structure of a GaN semiconductor light-emitting device is fabricated on the n-type GaN crystal film 65. In an MOCVD apparatus is placed the substrate with the n-type GaN crystal film 65, on which then are sequentially deposited an n-type GaN layer 66, an n-type AlGaN cladding layer 67, an n-type GaN light guide layer 68, a multiquantum-well-structure active layer 69 consisting of an undoped InGaN quantum well layer and an undoped InGaN barrier layer, a p-type AlGaN layer 70, a p-type GaN light guide layer 71, a p-type AlGaN cladding layer 72 and a p-type GaN contact layer 73 at predetermined conditions such as a temperature, a gas flow, a ratio of group V/group III elements, to fabricate a light-emitting device structure (FIG. 11(c)).

Then, the substrate with the light-emitting device structure is placed on a grinding machine and then is ground to remove the substrate 1, the base crystal film 2, the mask 4 and a part of the GaN crystal film for exposing the n-type GaN crystal film 65. An n-type electrode 74 is formed on the exposed surface of the GaN crystal film, i.e., the rear face of the GaN semiconductor light-emitting device while a p-type electrode 75 is formed on the front face (FIG. 11(d)).

In this embodiment, the following improvements may be obtained.

Growing a GaN semiconductor device structure on a GaN crystal film of this invention may improve crystallinity of an epitaxial growth film in the GaN semiconductor device structure which has been a problem in a conventional growth process using a sapphire substrate and improve device properties.

In particular an electrode may be formed on the rear face for a GaN semiconductor light-emitting device. It may, therefore, allow a device to be fabricated without forming an electrode on a GaN crystal film via complex fabrication steps such as dry etching required in the prior art; i.e., via a simplified electrode-forming process.

When a GaN semiconductor light-emitting device is a GaN semiconductor laser, a substrate and a mask or so may be removed after the growth of a GaN crystal thick film with a small number of crystal defects. It may make it possible to form a GaN semiconductor laser structure having a resonator mirror by cleavage. Since a sapphire has a cleavage plane different from that for a GaN crystal, it has been difficult to form a resonator mirror of a laser structure fabricated on a sapphire substrate by cleavage. On the other hand, since a thick GaN crystal film 65 with a small number of crystal defects may be grown in this invention, removal of a sapphire substrate or mask may not affect a GaN semiconductor laser structure fabricated on the GaN crystal film 65. Furthermore, since the laser structure on the GaN crystal film 65 may advantageously provide a resonator mirror surface by cleavage, it may contribute to significantly simplifying a process and considerably improving an yield, compared with forming a resonator mirror surface by a conventional complicated process comprising dry etching.

In the above description, the layered structure of the GaN semiconductor device is fabricated on the GaN crystal film and then the substrate 1, the mask 2 and a part of the GaN crystal film 65 are removed. Alternatively, after forming a GaN crystal film is formed and then removing a substrate 1, a mask 2 and a part of the GaN crystal film 65, a layered structure of a GaN semiconductor device may be fabricated.

This invention may be also applied to a GaN semiconductor device such as an FET and an HBT in addition to a GaN semiconductor light-emitting device such as a GaN semiconductor laser and a GaN LED.

Dislocation Character Composition in a GaN Crystal Film

For a GaN crystal film grown on a sapphire substrate according to the above growing process for a GaN crystal film, it was found by the above TEM analysis that in the GaN crystal film from which the sapphire substrate and a mask has been removed, a majority of dislocations are those having a displacement vector tilted from the c plane of the GaN crystal (Type-B dislocation). On the other hand, in a GaN crystal film directly grown on a sapphire substrate by a conventional common process (a crystal layer region except for the sapphire substrate), a proportion of Type-B dislocation was below 30%. A ratio of Type-A dislocation having a displacement vector parallel to the c plane of the GaN crystal to the total dislocations was less in the upper layer region in the GaN crystal film of this invention (a crystal region where a lower part including a sapphire substrate and a mask has been removed) than in a conventional GaN crystal film; specifically, almost all of the dislocations in the upper region of the crystal film of this invention were Types-A and B.

A GaN crystal film of this invention has the above characteristic dislocation structure where a proportion of Type-B dislocation is increased in the GaN crystal film; it means, in turn, that Type-A dislocations are reduced, i.e., an overall dislocation density is reduced. It is, therefore, preferable that a GaN crystal film for a semiconductor device such as a semiconductor laser is one in which at least 50% of dislocations are Type-B. It is preferable that a proportion of the number of Type-A dislocation to the total dislocation number is less than 50%. Furthermore, the dislocation density for Type-A dislocation is preferably less than $1 \times 10^8/$ cm$^2$. The dislocation density for overall dislocations in the GaN crystal film is preferably below $2 \times 10^8/$cm$^2$, more preferably below $1 \times 10^7/$cm$^2$.

For providing an appropriate GaN crystal film after removing a lower part including a sapphire substrate and a mask, the GaN crystal film formed on the sapphire substrate has a thickness of preferably 20 μm to 1 mm, more preferably 80 μm to 500 μm. The thickness of the GaN crystal film in the lower part removed together with the substrate is preferably below 300 μm, more preferably 5 to 150 μm. When a base crystal layer has been formed, it is preferably removed together with the lower part including a sapphire substrate.

Although a crystal film consisting of GaN has been described, this invention may be applied to any group III element nitride semiconductor having a wurtzite crystal structure. Examples of a group III element nitride semiconductor other than GaN include InGaN, AlGaN and InN. Although a group III element nitride semiconductor consisting of boron and nitrogen has a cubic crystal structure, this invention may encompass a group III element nitride semiconductor containing boron to some extent as long as the wurtzite crystal structure can be maintained.

Group III Element Nitride Semiconductor Wafer

A group III element nitride semiconductor suitable for a semiconductor device such as a semiconductor laser, i.e., a group III element nitride semiconductor wafer has a layer region where at least 50% of dislocations are those having a displacement vector (Burgers vector) tilted from the c plane in the wurtzite crystal structure (Type-B dislocation). A proportion of the number of Type-B dislocation to the total dislocation number in this layer region is preferably at least 60%, more preferably at least 70%, further preferably 70% to 90%. It is ideal that the ideal state in this invention where dislocations in the layer region is ultimately minimized is that where dislocations other than Type-B locations (in particular Type-A dislocations) are completely inhibited. The most preferable proportion of Type-B dislocation is, therefore, 100%, which is the upper limit for a proportion of Type-B dislocation.

A group III element nitride semiconductor wafer suitable for a semiconductor device such as a semiconductor laser has a layer region where below 50% of dislocations are those having a displacement vector parallel to the c plane in the wurtzite crystal structure (Type-A dislocation). A proportion of the number of Type-A dislocation to the total dislocation number in this layer region is preferably less than 40%, more preferably less than 30%, further preferably 10% to 30%. It is ideal that the ideal state in this invention where dislocations in the layer region is ultimately minimized is that where dislocations other than Type-B locations (in particular Type-A dislocations) are completely inhibited.

A group III element nitride semiconductor wafer suitable for a semiconductor device such as a semiconductor laser has a layer region where at least 50% of dislocations are those having a displacement vector tilted from the c plane in the wurtzite crystal structure (Type-B dislocation) while below 50% of dislocations are those having a displacement vector parallel to the c plane (Type-A dislocation). It is preferable that proportions of Type-B and Type-A dislocations are at least 60% and less than 40%, respectively; more preferably, at least 70% and less than 30%, respectively.

It may be preferable for improving a crystal quality that an overall dislocation density in a group III element nitride semiconductor wafer of this invention is as low as possible. However, the density practically depends on a dislocation density in a GaN crystal region, a base crystal film or a substrate before lateral growth over a mask (selective lateral growth (ELO growth)) as well as a proportion of Type-A dislocation to overall dislocations before ELO growth. It is, therefore, below $2 \times 10^8/$cm$^2$, more preferably $1 \times 10^8/$cm$^2$, especially preferably $5 \times 10^7/$cm$^2$.

Since a proportion of Type-B dislocation increases in proportion to reduction of Type-A dislocations, it may be preferably as high as possible. It may be, however, influenced by various factors such as a proportion of Type-A dislocation to overall dislocations in a GaN crystal region, a base crystal film or a substrate before ELO growth as well as a mechanism for re-reaction between dislocations which occurs when a crystal layer is grown to be relatively thicker after lateral growing.

It is preferable that the above group III element nitride semiconductor wafer of this invention has a layer region where a dislocation density in a wurtzite crystal structure almost monotonously decreases along one direction of the c axis.

A group III element nitride semiconductor wafer of this invention having the above dislocation character composition for Type-A and Type-B dislocations may be one of the following types;

(a) a group III element nitride semiconductor crystal film having a hetero-substrate used for crystal growth in one main surface;

(b) a group III element nitride semiconductor crystal film in which at least a hetero-substrate used for crystal growth has been removed;

(c) a group III element nitride semiconductor crystal film having a hetero-substrate used for crystal growth in one main surface and an additional crystal layer in the other main surface; and (d) a group III element nitride semiconductor crystal film as described in the above (c) in which at least a hetero-substrate used for crystal growth has been removed.

For Type (b), a lower crystal layer region including a mask in the hetero-substrate side may be removed together with the hetero-substrate used for crystal growth to provide a crystal film whose whole region has the above dislocation character composition for Type-A and Type-B dislocations.

For Type (d), a lower crystal layer region including a mask in the hetero-substrate side may be removed together with the hetero-substrate used for crystal growth to provide a crystal film in which the layer region comprising the group III element nitride semiconductor crystal film has the above dislocation character composition for Type-A and Type-B dislocations.

The most preferable hetero-substrate is a sapphire substrate, but a substrate made of, for example, Si, ZnO, SiC, LiGaO$_2$ or MgAl$_2$O$_4$ may be used.

Control of Dislocation Formation by Treating a Mask Surface

According to this invention, during forming a group III element nitride semiconductor crystal film using selective lateral growth (ELO growth), a mask surface on a substrate may be treated to control a dislocation structure in a group III element nitride semiconductor crystal. Such control of dislocation may provide a high-quality group III element nitride semiconductor wafer having the above preferable dislocation character composition, a reduced overall dislocation density and a small number of defects.

The mechanism for such control of dislocation formation will be described for a GaN crystal film.

Figure 12A:
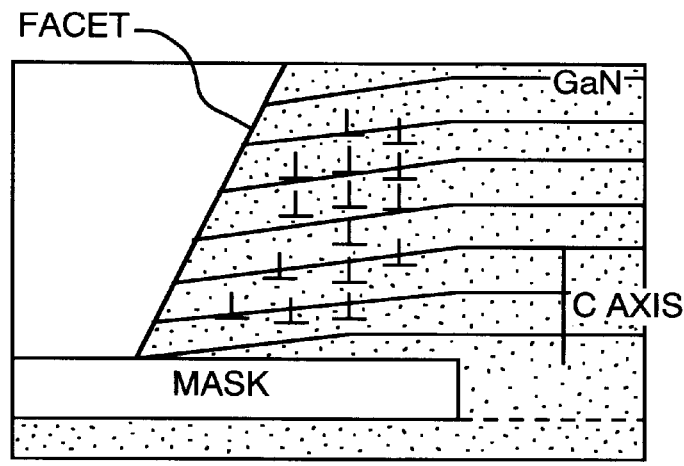
FIG. 12 schematically illustrates a status of dislocations in the vicinity of a mask in growing a crystal according to this invention; (a) is a partial cross section and (b) is a partial plane view.
Figure 12B:
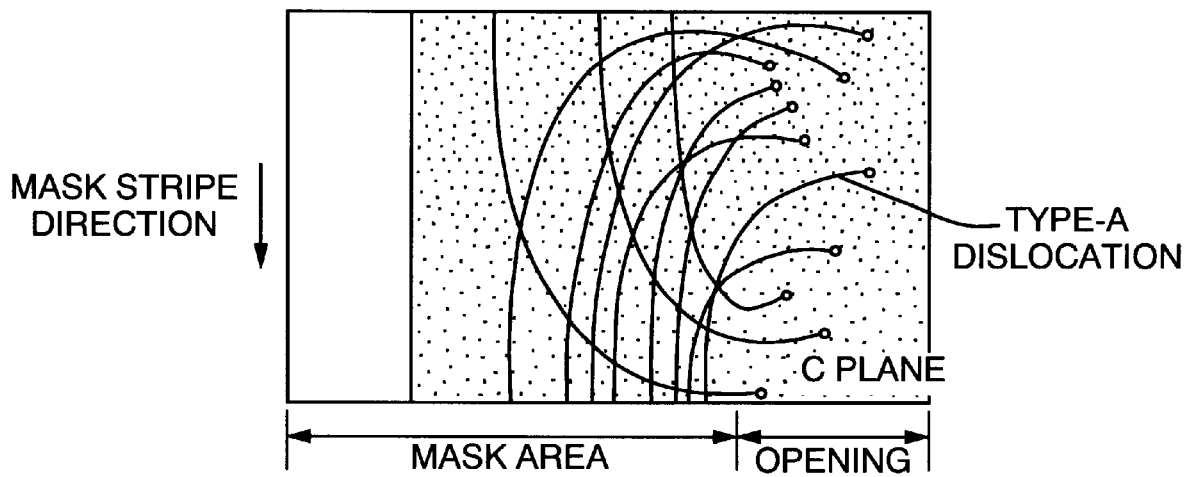

FIG. 12(a) is a schematic partial cross-section perpendicular to a mask stripe representing a typical state before a crystal film with a flat surface is formed and before GaN crystals having a facet are contacted and coalesced with each other in ELO growth of a GaN crystal. All the dislocations within the crystal region over the mask propagate and are aligned along the mask stripe direction in a manner that an extra half plane is present in the upper side as indicated by the sign "⊥" in the figure. FIG. 12(b) is a schematic view showing the above dislocation course, which is a partial plane view from a direction along the c axis of the GaN crystal.

As indicated in these figures, TEM analysis as described above reveals that for a dislocation type in the GaN crystal film of this invention, edge dislocations running along the c axis on the sapphire substrate, i.e., those having a displacement vector parallel to the c plane of the GaN crystal (Type-A dislocation) are bent in a growth region over the opening to run toward the mask in the c plane and is again bent to propagate along the mask stripe. In other words, accelerating re-propagation of Type-A dislocations along the mask stripe may control propagation to the c-axis direction which is likely to occur during contact and coalescence of crystals over the mask, i.e., may minimize dislocations threading to the film surface. As a result, it may lead to reduction in a threading dislocation density for Type-A dislocation.

Next, a mechanism for further accelerating re-propagation of Type-A dislocations along a mask stripe direction within a c plane will be described.

Propagation behavior of Type-A dislocation in a c plane depends on a shear stress perpendicular to a mask stripe direction in the crystal. The shear stress is generated mainly by a force working in an interface between a ELO-growing GaN crystal and the mask. The state shown in FIG. 12(a) where an extra half plane for each dislocation is present in an upper region is observed when a force compressing the interface is working. Increase of the compressive force facilitates propagation of Type-A dislocation along the mask stripe.

Such a compressive force may be controlled by altering intensities of a surface tension working on the surface of the mask material or the GaN crystal and of an interfacial tension between the GaN crystal and the mask.

Figure 13:
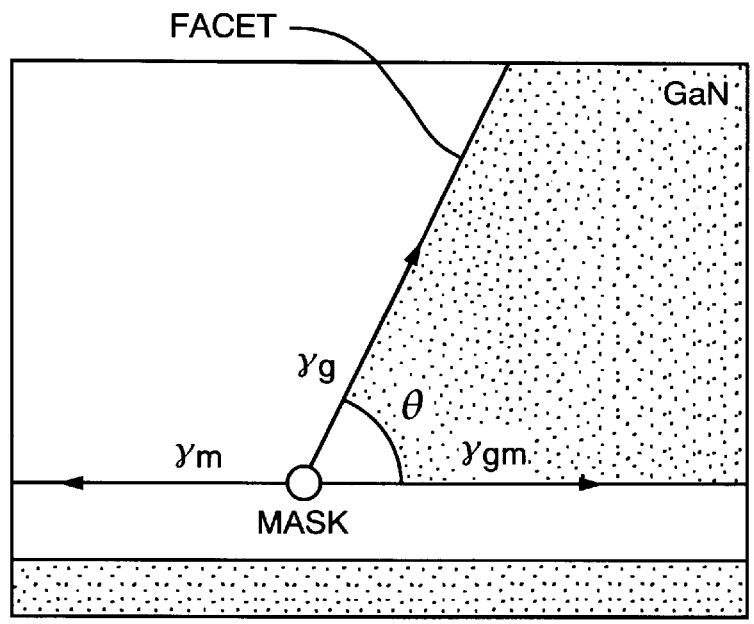
FIG. 13 is a schematic partial cross section in the vicinity of a mask for illustrating a status of surface (interface) tensions working on a mask surface, a facet surface and a crystal/mask interface, in growing a crystal according to this invention.
Figure 14:
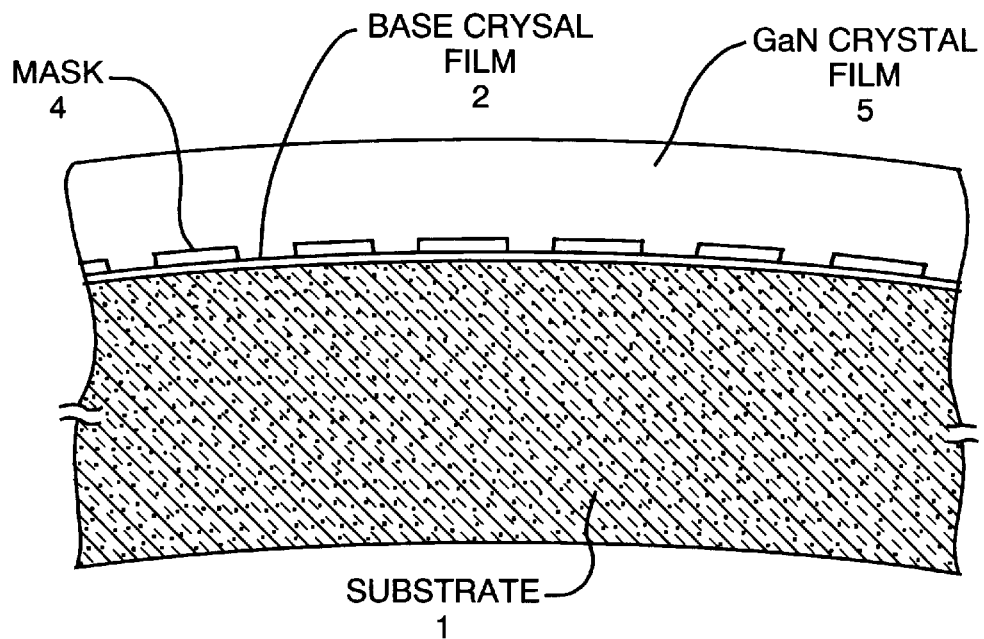
FIG. 14 is a schematic cross section illustrating a status of curving in a wafer.
Figure 15A:
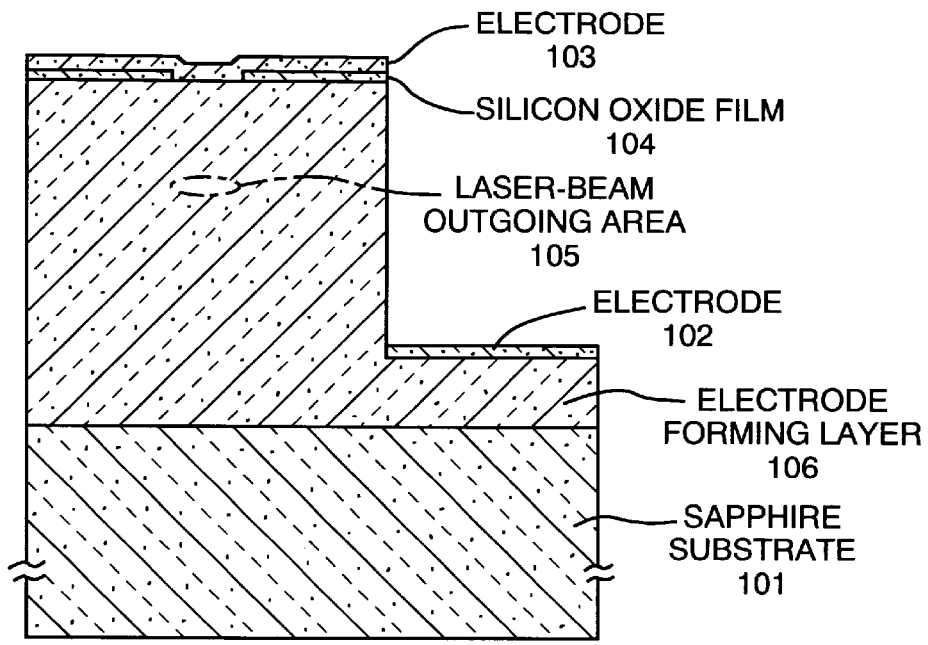
FIG. 15 is a schematic cross section of a laser structure viewing from a cross section of a Fabry-Perot resonator.
Figure 15B:
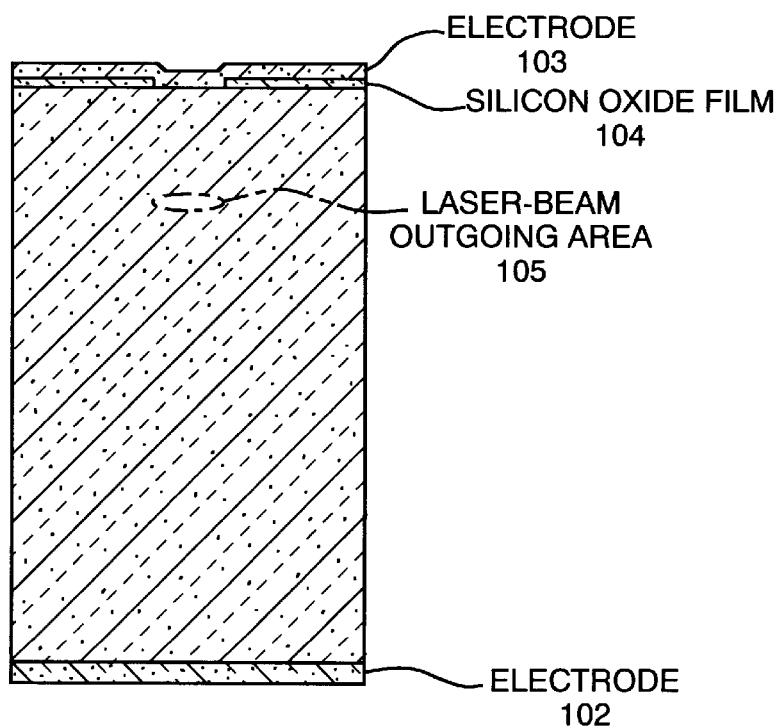

FIG. 13 shows surface (interfacial) tensions working at a triple point for a mask surface, a facet surface and a GaN/mask interface ($\gamma_m$, $\gamma_g$ and $\gamma_{gm}$, respectively).

A net compressive force F (>0) working to the GaN/mask interface can be represented by the following equation:

$$F = \gamma_{gm} + \gamma_g \cos\theta - \gamma_m$$

where θ is an angle formed between the facet surface and the GaN/mask interface.

As seen from this equation, the compressive force F can be increased by increasing $\gamma_{gm}$ or $\gamma_g$ or decreasing $\gamma_m$.

One approach for increasing the F value, i.e., compressive force, is to reduce $\gamma_m$ by treating the mask surface, by which there increases an intra-crystal shear stress working in the crystal film during ELO growth, to facilitate re-propagation of Type-A dislocation along the mask stripe direction.

Dislocations exposed in a facet surface may propagate again to the c-axis direction after ELO growth proceeds so that facets become in contact with each other. Such dislocations have a nature of propagating toward the surface as the GaN crystal layer grows after coalescence of facets, resulting in increase of a threading dislocation density in the film surface.

According to the process of this invention where the mask surface is treated, most of Type-A dislocations in a crystal over a mask before facet coalescence are present along the mask stripe direction due to the above mechanism. Thus, a considerably small number of dislocations are exposed in the facet surface. It may cause reduction in the number of dislocations propagating to the c-axis direction after facet coalescence over the mask, resulting in reduction of the threading dislocation density for Type-A dislocation.

On the other hand, Type-B dislocation having a displacement vector tilted from the c plane of the GaN crystal and present within the c plane does not behave as Type-A dislocation even when the above shear stress is generated in the crystal. It is because the displacement vector of Type-B dislocation in the crystal region over the mask is not present in a sliding plane where a dislocation can easily move. A dislocation terminal may be, therefore, exposed in the facet surface more frequently in Type-B dislocation than in Type-A dislocation. By coalescence of facets from this state, it becomes more probable that Type-B dislocation is again bent at the coalescence site to the c-axis direction and finally remains as a threading dislocation in a GaN crystal film thus formed.

From the above principle, mainly in response to an extent of reduction in Type-A dislocations, an overall threading dislocation density in a GaN crystal film reduces while a proportion of Type-B dislocation to overall threading dislocations increases.

Cleaning of a Mask Surface

One approach for reducing a surface tension $\gamma_m$ in a mask surface is cleaning the surface after forming a mask. A mask may be cleaned by, for example, wet etching using an agent such as buffered hydrofluoric acid, dry etching such as physicochemical etching using radical ion beam or ion beam, ozone irradiation, ultraviolet irradiation, heating in a reducing atmosphere and combination thereof.

Heating in a reducing atmosphere may be conducted, for example at 400 to 800° C. in an atmosphere of hydrogen. This heating process may reduce impurities comprising oxides adhered to the mask surface in a photoresist process such as resist removal by, for example, ashing, to be converted into highly volatile elements or compounds and thus to be removed from the mask surface.

Among these cleaning processes, it is preferable to expose a fresh and clean surface by etching the surface to a certain extent; such a treatment is preferably etching. For such a certain extent of etching, the surface is etched preferably by 1 to 500 nm, more preferably by 10 to 200 nm.

Such a cleaning process may remove impurities adhered to the mask surface which have been generated during mask formation, resulting in reduction of the surface energy of the mask surface, i.e., the surface tension $\gamma_m$. Such an effect may be prominent when the mask is formed by photolithography. The above process may almost completely remove residues of mask materials such as $SiO_2$ in photolithography, residues of resist materials and impurities derived from these residues.

As a pre-treatment before these cleaning processes, removal by dissolving may be conducted using an organic solvent such as ethyl methyl ketone, ethanol and methanol. In addition, the surface may be subject to ultrasonic cleaning during the dissolving process. Furthermore, contaminants on the surface may be removed with an oxidizing or reducing agent. High-pressure blow by blasting water or gas may be applied. It is preferable to wash the surface with pure water before these pre-treatment processes.

Cleaning of a surface when $SiO_2$ is used as a mask material has been herein described. A mask material is, however, not limited to $SiO_2$, and another mask material such as SiNx and W may be comparably effective in reducing the surface energy, i.e., surface tension, of the mask.

Removal of a Hetero-Substrate from a Wafer

When forming a device using a wafer thus formed, all the above problems associated with curving can be avoided by conducting epitaxial growth after removing a hetero-substrate such as sapphire from the wafer. Specifically, a device-forming process such as optical lithography may be conducted without dividing the wafer; cleavage may be easily conducted; and an electrode may be formed on the rear face (the face in the side of the hetero-substrate). It may also eliminate the problems of difficulty in placing a wafer on a holder and a temperature distribution during epitaxial growth for forming a device structure such as a double-hetero structure (DH structure).

If a wafer is significantly curved, it is difficult to precisely form a pattern in the wafer surface on which an epitaxial growth layer or a device structure such as a DH structure on the layer has been formed, over the whole surface of the wafer. It has been already described that to precisely form a pattern, some technique should be applied; for example, cutting the wafer into parts with a small area, e.g., about 5 $mm^2$ before optical lithography or so.

When a hetero-substrate is made of a material with excellent heat transfer characteristics such as sapphire, a wafer according to this invention may be employed as a heat sink for a device formed later. In the light of the problem of curving, it is sometimes advantageous to leave the hetero-substrate.

However, the problem of curving is significant in a process using a large wafer, and it is, therefore, preferable to remove the hetero-substrate. It is necessary to remove the hetero-substrate for solving the above problems in terms of cleavage and positioning an electrode on a rear face which may occur in the case of an optical device, in particular a semiconductor laser, comprising nitrogen as a group III element such as GaN.

In other words, it is preferable to completely remove at least a hetero-substrate for a group III element nitride semiconductor wafer of this invention. Thus, there is provided a group III element nitride semiconductor wafer having a striped insulator on one main surface. Although the mask consisting of the stripe insulator may be left to be used for positioning in a device formation process, it is preferably removed in the light of electrode formation on the rear face as described above. If there is a base crystal layer on the hetero-substrate, it is preferable to remove the base crystal layer. Specifically, it is more preferable to remove the hetero-substrate and, if present, a buffer layer, as well as the mask.

The mask may be removed by selective etching, for example, etching with diluted hydrofluoric acid when the mask is made of $SiO_2$, to leave a striped groove in the rear face of the wafer. Thus, there may be provided a group III element nitride semiconductor wafer having a striped etching pattern in one main surface. Since the etching pattern is formed according to a mask pattern, a group III element nitride semiconductor wafer whose etching pattern has a stripe direction of <11–20> or <1–100> may be provided as a preferable wafer. The striped groove as the track of the mask can be used for positioning in a device forming process. Since such a groove in the rear face of the wafer may easily uptake dusts or soil which is difficult to be removed, it is preferable to grind or polish the wafer for flattening its rear face after removing the mask.

Removal Procedure of a Hetero-Substrate

A procedure for removing a hetero-substrate will be described, showing a specific example where a sapphire substrate is removed by grinding from a wafer fabricated by growing a GaN crystal with a thickness of about 250 $\mu$m on the sapphire substrate.

First, the surface in the side of GaN crystal (wafer front face) is protected by an argillaceous so-called compound. Then, the exposed sapphire surface (wafer rear face) is ground by sandblasting. Since sandblasting involves colliding particles of zirconia, alumina or silicon carbide to the surface to be ground at a high speed from a nozzle, it is suitable to high-speed grinding of a curved material. It is preferable to use particles of around No. 500 as a measure for a particle size, for high-speed grinding and around No.300 (a relatively smaller particle size) for low-speed grinding. The particles are preferably zirconia which exhibited good grinding properties for a hetero-substrate other than sapphire such as silicon carbide and $MgAl_2O_4$.

Grinding by sandblasting was continued until the thickness of the sapphire substrate became about 50 $\mu$m. Then, it was observed after removing the compound that the curvature was significantly improved. At the same time, there generated a number of cracks on the sapphire substrate, and the curvature was corrected sufficiently to compensate reduction of thickness in the sapphire substrate.

Cracks were generated even when the thickness of the sapphire was 100 $\mu$m, and thus curving was substantially eliminated.

If cracks do not generate after grinding by sandblasting and then removing the compound, curving may considerably remain. However, even in this case, cracks may be generated on the sapphire substrate by cooling it by means of exposure to a refrigerant such as dry-ice and liquid nitrogen, for minimizing curving.

For substantially eliminating curving by generating cracks, it is preferable that a hetero-substrate has a thickness less than a half of that of an epitaxial layer when the epitaxial layer has a thickness of 100 to 500 $\mu$m. A crystal may be epitaxially grown on a relatively thicker hetero-substrate and the hetero-substrate may be then ground to a thickness of below of that of an epitaxial layer. Alternatively, a crystal may be epitaxially grown on a hetero-substrate with a thickness of less than half of that of an epitaxial layer to be formed. For example, a GaN layer with a thickness of 500 $\mu$m is epitaxially grown on a sapphire substrate with a thickness of 200 $\mu$m, so that cracks are generated on the sapphire substrate during cooling from a growth temperature to an room temperature, resulting in reduction of the curvature. Even if cracks are not generated, the substrate may be cooled by soaking it in a refrigerant for easily generating cracks, resulting in reduction in the curvature.

The sapphire substrate can be completely removed by sandblasting, but it is preferably left with a thickness of 10 $\mu$m for avoiding damages to the GaN layer due to sandblasting as much as possible.

The wafer in which curving has been thus eliminated may be flatly applied on a usual weighting for grinding on its GaN growth plane (wafer front plane) and then the sapphire substrate, the base crystal layer and the mask for selective growth may be removed by grinding as usual. Thus, a wafer consisting of a GaN epitaxial layer may be provided. Actually, grinding was continued to reach the GaN epitaxial layer while monitoring the overall thickness of the wafer after the mask for selective growth was exposed.

In such a grinding process, grinding may be stopped before reaching the selective growth mask and when the mask become exposed, and then the mask may be removed by etching. If the mask is made of $SiO_2$, it can be readily removed with diluted hydrofluoric acid.

As described later, since a region around the mask has a relatively higher dislocation density, a layer region including the region (hereinafter, referred to as a "high dislocation-density layer") is preferably removed during the above grinding process.

For a wafer consisting of a GaN epitaxial layer, a thickness of at least about 200 $\mu$m is sufficient to provide adequate strength for forming a DH structure thereon as described later or any of fabrication processes for a variety of devices.

Fabrication of a Blue Semiconductor Laser

Fabrication of a blue semiconductor laser will be described showing an example where using, as a substrate, a wafer consisting of a GaN epitaxial layer with a diameter of 1 inch formed as described above (hereinafter, referred to as a "GaN substrate"), a DH structure for a semiconductor laser was grown on the GaN substrate, and then a blue semiconductor laser was fabricated.

Although there are a variety of processes for fabricating a DH structure, it can be herein fabricated by an essentially similar process to that for fabricating a semiconductor on a conductive substrate such as a GaAs substrate and an InP substrate.

Figure 16:
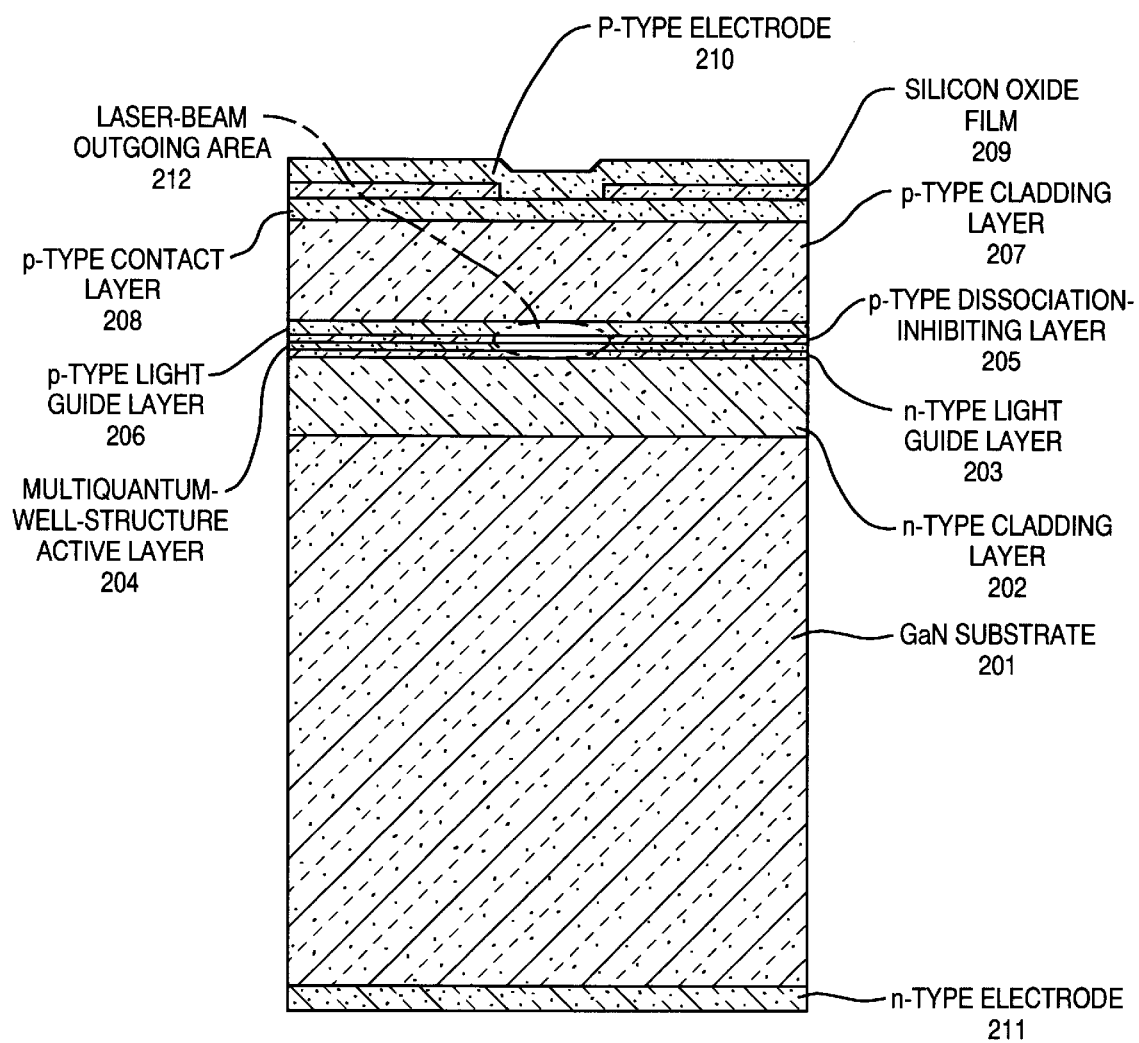
FIG. 16 is a cross section of a semiconductor laser structure having a double-hetero structure.

FIG. 16 shows a structural cross-section viewing from a cross-section of a resonator in a semiconductor laser having a DH structure formed on a GaN substrate. From the side of the GaN substrate 201 were sequentially formed a silicon-doped n-type $Al_{0.05}Ga_{0.95}N$ cladding layer 202 with a thickness of 0.5 $\mu$m, a silicon-doped n-type GaN light guide layer 203 with a thickness of 0.1 $\mu$m, a multiquantum-well-structure active layer 204 consisting of 7 periods of an undoped $In_{0.2}Ga_{0.8}N$ quantum well layer with a thickness of 30 Å and an undoped $In_{0.05}Ga_{0.95}N$ barrier layer, a magnesium-doped p-type $Al_{0.2}Ga_{0.8}N$ indium-dissociation-inhibiting layer 205 with a thickness of 200 Å, a magnesium-doped p-type GaN light guide layer 206 with a thickness of 0.1 $\mu$m, a magnesium-doped p-type $Al_{0.05}Ga_{0.95}N$ cladding layer 207 with a thickness of 0.5 $\mu$m and a magnesium-doped p-type GaN contact layer 208 with a thickness of 0.2 $\mu$m by a MOCVD technique. As the top layer of the DH structure, a silicon oxide film 209 was formed, on which was then formed a striped current-injection window with a width of 10 $\mu$m, and then a p-type electrode 210 consisting of nickel and gold was formed. In this figure, 212 is a laser-beam outgoing area. The wafer was applied on a weighting for grinding on its p-type electrode face, the GaN substrate was ground to a cleavable thickness (generally, 60 $\mu$m to 100 $\mu$m), and an n-type electrode 211 consisting of titanium and aluminum was formed on the rear face. Then, a resonator face was formed by cleavage and cut between neighboring current-injection windows to provide a blue laser device pellet. The final laser product had a stripe length, i.e., a spacing between resonators, of 250 $\mu$m.

The above process provides an advantage that a wafer may be ground to a cleavable thickness just before forming an electrode on a rear face, allowing a stripe structure for narrowing an upper current or an electrode on a front face to be formed for a thick wafer.

Laser Characteristics

The semiconductor laser thus formed was pulse-operated at an room temperature (ca.25° C.) to determine its threshold. An observed threshold current for the laser was an appropriate value of about 120 mA (current density: about 4 $kA/cm^2$). On the other hand, a laser fabricated using, as a substrate, a GaN wafer grown on a sapphire substrate without a mask for selective growth gave a higher value by about 50 mA.

It may be because a dislocation density was reduced, in particular, a Type-A dislocation density was significantly reduced. A GaN system may provide a light-emitting diode exhibiting a high luminance even in a crystal with a high dislocation density. It may be suggested that a dislocation does not make a contribution very much as a non-radiative recombination center for a minority carrier. A threshold current is, however, not sufficiently lowered. As is well known, a semiconductor laser requires conditions for achieving an optical gain to a guided wave in an active layer. As described above, Type-A dislocations may, however, cause a tilt boundary in a crystal, where light scattering tends to occur. In other words, it can be supposed that due to light scattering in a tilt boundary, an optical gain to a guided wave was not sufficiently to reduce the threshold in a crystal having a high Type-A dislocation density. On the contrary, in a wafer according to this invention, a Type-A dislocation density could be significantly reduced to reduce scattering of a guided wave in the DH-structure active layer grown on the wafer of this invention, so that the optical gain was increased sufficiently to reduce the threshold.

All lasers used for determination of a threshold were those in which cleavage occurred within 1 cm diameter from the center of the wafer and were selected from those without damages in a cleavage plane to be a resonator. It was, however, found that these could be classified into two types according to their threshold dispersion. Those with a small threshold dispersion and with a relatively large threshold dispersion are designated as Group-A and Group-B wafers, respectively, which will be described.

For Group-A wafers, a threshold dispersion was within about 10% and the highest threshold did not exceed 120% of the wafer-group average, while for Group-B wafers, a threshold dispersion was also within about 10% and there were wafers whose threshold average was 1.5-fold of the wafer-group average in a proportion of about one by 10 to 20.

Group-A and Group-B wafers were scrutinized for their differences, but no significant differences were observed for final lasers. Then, a cross-sectional structure was checked for wafers after epitaxial growth of a DH structure. It was consequently found that a Group-A wafer had low-dislocation layers throughout the cross section of the GaN substrate wafer, while a Group-B wafer had a high-dislocation density layer near the rear face of the GaN substrate wafer.

It has not been fully understood at present how such a high dislocation-density layer influences a DH epitaxial layer and a laser threshold. It might be, however, explained as follows; as described above, when there is a high dislocation-density layer in a GaN substrate wafer, dislocations in the layer may be subject to some reaction or cause edge dislocations bent to a direction parallel to the wafer surface to be again bent to the depth direction and finally to reach a DH epitaxial layer, after epitaxial growth of the DH structure or during heating at an elevated temperature in a subsequent process. As described above, wafers with a higher threshold were obtained in an incidence of one per 10 to 20. A possible explanation for the phenomenon is, as also supposed from FIG. 9, as follows; there is a variation in a dislocation density in an initial growth layer comprising a high dislocation-density layer in a GaN substrate epitaxial layer, corresponding to a period of striped masks for selective growth and thus such a wafer might be generated when a set of dislocations associated with the periodic variation, in particular, those from a high dislocation-density region, reach a striped active layer region for current narrowing.

In the light of a production yield and the number of processes for property testing, it may be, therefore, preferable to epitaxially grow a DH structure using a GaN substrate from which a high dislocation-density layer has been completely removed. Specifically, it is preferable to use a GaN substrate from which a sapphire substrate, a base crystal layer, a mask and a high dislocation-density layer near the mask have been completely removed, for fabricating a semiconductor laser. It should be, however, noted that the GaN substrate should have an appropriate thickness for epitaxial growth for fabricating a laser structure.

Although there have been described properties for a laser fabricated using, as a substrate, a GaN wafer grown on a sapphire substrate, a laser fabricated using, as a substrate, a GaN wafer which was doped with Al during growing on a sapphire substrate, i.e., an AlGaN wafer, was also checked for its properties. The laser thus formed was that exhibiting a reduced threshold current by about 20 mA. Its $Al_{0.05}Ga_{0.95}N$ cladding layer 202 had a thickness of 1.5 $\mu$m. The reduction in a threshold current might be caused by a light confinement effect associated with a thickened cladding layer 202, indicating that a threshold current and a differential quantum efficiency may be further improved by thickening an upper cladding layer 207.

Improvement in Reproductivity of a Threshold by Flattening a Growth Surface

When epitaxially growing a DH structure of a semiconductor laser, surface conditions, i.e., flatness of a growth surface, for a GaN substrate should be paid attention. Unless the growth surface is flat, flatness of a DH structure epitaxial layer, in particular an active layer, cannot be assured. Although in the light of wave guiding it is apparently important to assure flatness of the active layer, it should be particularly avoided that an angle between a resonator plane formed by crystallographically determined cleavage and an active layer plane is deviated from a right angle. It is because if there is such an angle deviation, a guided light may be significantly lost when it is reflected by the resonator plane, leading to increase of a threshold. An allowance for the angle may be considerably less than 1 degree.

In general, a growth surface in a GaN substrate is formed after epitaxial growth by as thick as 100 $\mu$m or more and therefore often has a growth stripe pattern or swelling. Thus, from a GaN substrate were removed a sapphire substrate and then a high dislocation-density layer near a mask together with the mask. The GaN substrate was removed from the weighting for grinding and replaced on it upside down. The top growth layer of the GaN substrate was ground to remove the growth stripe pattern and the swelling. Then the GaN substrate was subject to epitaxial growth for fabricating a DH structure. Specifically, epitaxial growth was conducted on the flat surface provided by grinding the grown surface in the GaN substrate. Stripe lasers fabricated using a GaN substrate thus obtained as a wafer exhibited a small threshold dispersion and excellent laser properties.

Alternatively, epitaxial growth for forming a DH structure was conducted on a rear face of a GaN substrate from which a sapphire substrate, a base crystal layer, a mask and a high dislocation-density layer have been removed, i.e., the surface in the side where there have been the removed sapphire substrate, to fabricate a semiconductor laser. That is, a device structure was fabricated on one surface having a higher dislocation density of two main surfaces, front and rear faces, in a group III element nitride semiconductor wafer. The semiconductor laser thus obtained also exhibited good laser properties such as a threshold. This process eliminates a grinding step for removing a growth stripe pattern or a swelling on a growth surface. A dislocation density may be slightly higher than that for a device provided by growth on a front-surface of a GaN substrate. A semiconductor laser exhibiting good laser properties such as a threshold may be, however, provided by adequately removing the high dislocation-density layer near the mask.

A semiconductor laser whose DH structure is flat has been described. There have been various techniques for horizontal and lateral mode control, such as processing a substrate surface for carving a groove on a part to be a current injection area before epitaxial growth for forming a DH structure. A group III element nitride semiconductor wafer such as a GaN substrate of this invention can be successfully applied to such a technique.

A group III element nitride semiconductor wafer of this invention may be effectively applied an electron transport device such as a field effect transistor to improve, for example, electron mobility as well as a production yield or reliability for an electrode. Improvement in electron mobility may be caused by reduction of scattering in a tilt boundary due to Type-A dislocation. Improvement in reliability of an electrode may be caused by reduction of abnormal diffusion along a dislocation line of an electrode metal, in particular Type-A dislocation, as a result of reduction in dislocations, which may be applicable to a semiconductor laser. Thus, a wafer of this invention may be applicable to a variety of highly-integrated semiconductor devices and may considerably contribute to realize an elevated-temperature-operable and high-performance semiconductor device properly operable even when placed near a heat-generating apparatus such as an automobile engine, which is expected to be a promising application for a group III element nitride semiconductor.

EXAMPLES

This invention will be specifically described by examples with reference to the drawings.

Example 1

This example will be described with reference to FIG. 1. In this example, a substrate used was a (0001) plane sapphire ($Al_2O_3$) substrate 1 on which a GaN film (a base crystal film) 2 with a thickness of 1 $\mu$m was formed in advance. The base crystal film was grown with an MOCVD apparatus. Specifically, sapphire was heated to 450° C., on which GaN was then grown to a thickness of 400 Å while supplying trimethylgallium (TMG: $(CH_3)_3Ga$) as a Ga source and ammonia ($NH_3$). Then, the substrate was heated to 1000° C., on which a GaN was grown. On the surface of the GaN film 2 was deposited an $SiO_2$ film, in which striped masks 4 were formed by photolithography and wet etching, to separate growth areas 3. The growth areas 3 and the masks 4 were of a stripe shape with widths of 5 $\mu$m and 2 $\mu$m, respectively. The stripe direction was the <11–20> direction (FIG. 1(*a*)).

The GaN crystals on the growth areas 3 were grown by a hydride VPE technique using gallium chloride (GaCl) as a Ga source, which was a reaction product of gallium (Ga)

with hydrogen chloride (HCl), and ammonia gas (NH$_3$) as an N source. GaCl was formed by reacting metal Ga with HCl at about 800° C. in the upper stream region of the growing apparatus. The substrate was placed in a growing apparatus and heated to a growth temperature of 1000° C. in an atmosphere of hydrogen. After the growth temperature became stable, HCl and NH$_3$ were supplied at flow rates of 20 cc/min and 1000 cc/min, respectively, for 5 min to grow facets consisting of the {1–101} plane of a GaN crystal on the growth areas 3 (FIG. 1(*b*)). The epitaxial growth was continued for additional 20 min to grow the facets 6 until they covered the masks 4 (FIG. 1(*c*)).

The epitaxial growth was further continued to embed the facet structure (FIG. 1(*d*)). Finally, after growing for 5 hours in total, a GaN film 200 $\mu$m of thickness having a flat surface was formed (FIG. 1(*e*)). After forming the GaN crystal film 5, the substrate was cooled to room temperature while supplying ammonia gas and then removed from the growing apparatus.

It was observed that the GaN film 5 thus obtained had no cracks despite the fact that its lattice constant and coefficient of thermal expansion were different from those of the sapphire substrate 1. In addition, the thick GaN crystal film had a very small number of defects and its dislocation density was about $10^7$/cm$^2$ as determined by flat-plane observation near the film surface with a transmission electron microscope.

Since the GaN crystal film thus obtained had a very small number of defects, a high quality device structure such as a laser, an FET and an HBT may be fabricated on the film to improve device properties.

Example 2

This example will be described with reference to FIG. 11, which is a schematic cross-sectional flow chart for illustrating a process for fabricating a GaN semiconductor laser on a GaN crystal film of this invention.

On a (0001) plane sapphire substrate 1 was deposited a GaN film 2 with a thickness of 1 $\mu$m by MOCVD as described in Example 1. On the GaN film 2 was formed an SiO$_2$ film and striped masks 4 were formed by photolithography and wet etching as described in Example 1, to separate growth areas 3. The growth areas 3 and the masks 4 were of a stripe with widths of 5 $\mu$m and 2 $\mu$m, respectively. The stripe direction was tilted by 10 degrees from the <11–20> direction (FIG. 11(*a*)).

GaN crystals on the growth areas 3 were grown as described in Example 1, by hydride VPE technique using gallium chloride (GaCl) as a Ga source, which was a reaction product of gallium (Ga) with hydrogen chloride (HCl), and ammonia gas (NH$_3$) as an N source. The substrate was placed in a growing apparatus and heated to a growth temperature of 1000° C. in an atmosphere of hydrogen, during which the atmosphere was changed to an NH$_3$ gas atmosphere from 650° C. After the growth temperature became stable, while supplying HCl, NH$_3$ and silane (SiH$_4$) were supplied at flow rates of 40 cc/min, 1000 cc/min and 0.01 cc/min, respectively, for 150 min, an n-type GaN crystal film 65 with a thickness of 200 $\mu$m embedding the masks 4 were formed through the growth steps of FIGS. (*a*) to (*e*) as described in Example 1 (FIG. 11(*b*)). After forming the n-type GaN crystal film 65, the wafer was cooled to an room temperature in an NH$_3$ gas atmosphere and then removed from the growing apparatus. The GaN crystal film 65 had a carrier concentration of $1\times10^{18}$ cm$^{-3}$ or higher.

Then, a GaN semiconductor laser structure was fabricated by metalorganic vapor-phase epitaxy (MOVPE).

After forming the GaN film 65, the wafer was placed in an MOCVD apparatus, and heated to a growth temperature of 1050° C. in an atmosphere of hydrogen, during which the atmosphere was changed to an NH$_3$ gas atmosphere from 650° C. On the wafer were sequentially formed an Si-doped n-type GaN layer 66 with a thickness of 1 $\mu$m, an Si-doped n-type Al$_{0.15}$Ga$_{0.85}$N cladding layer 67 with a thickness of 0.4 $\mu$m, an Si-doped n-type GaN light guide layer 68 with a thickness of 0.1 $\mu$m, a multiquantum-well-structure active layer 69 consisting of 10-cycles of an undoped In$_{0.2}$Ga$_{0.8}$N quantum well layer with a thickness of 2.5 nm and an undoped In$_{0.05}$Ga$_{0.95}$N barrier layer with a thickness of 5 nm, a magnesium(Mg)-doped p-type Al$_{0.2}$Ga$_{0.8}$N layer 70 with a thickness of 20 nm, a magnesium-doped p-type GaN light guide layer 71 with a thickness of 0.1 $\mu$m, a magnesium-doped p-type Al$_{0.15}$Ga$_{0.85}$N cladding layer 72 with a thickness of 0.4 $\mu$m and a magnesium-doped p-type GaN contact layer 73 with a thickness of 0.5 $\mu$m, to fabricate a laser structure. After forming the p-type GaN contact layer 73, the product was cooled to an room temperature in an atmosphere of NH$_3$ gas, and then removed from the growing apparatus (FIG. 11(*c*)). The multiquantum-well-structure active layer 69 consisting of undoped In$_{0.2}$Ga$_{0.8}$N quantum well layers with a thickness of 2.5 nm and undoped In$_{0.05}$Ga$_{0.95}$N barrier layers with a thickness of 5 nm was formed at 780° C.

Then, the sapphire substrate having the laser structure was set on a grinding machine and the sapphire substrate 1, the GaN film 2, the SiO$_2$ masks 4 and 50 $\mu$m of the GaN crystal film 65 were removed by grinding to expose the GaN crystal film 65.

On the exposed surface of the GaN crystal film 65 was formed an n-type electrode 74 of titanium (Ti)-aluminum (Al), while on the p-type GaN layer 73 was formed a p-type electrode 75 of nickel (Ni)-gold (Au) (FIG. 11(*d*)).

Although in this example, the sapphire substrate 1, the GaN base crystal film 2, the SiO$_2$ masks 4 and a part of the GaN crystal film 65 were removed by grinding and then the n-type electrode was formed, dry etching rather than grinding may be employed to also remove the n-type GaN layer 66 or 65 and then an n-type electrode may be formed to provide a resonator mirror surface.

Example 3

This example will be described with reference to FIG. 1. In this example, a substrate used was a (0001) plane sapphire (Al$_2$O$_3$) substrate 1 on which a GaN film (a base crystal film) 2 with a thickness of 1 $\mu$m was formed in advance. The base crystal film was grown with an MOCVD apparatus. Specifically, sapphire was heated to 450° C., on which GaN was then grown to a thickness of 400 Å while supplying trimethylgallium (TMG: (CH$_3$)$_3$Ga) as a Ga source and ammonia (NH$_3$). Then, the substrate was heated to 1000° C., on which a GaN was grown.

On the surface of the GaN film 2 was deposited an SiO$_2$ film, in which striped masks 4 were formed by photolithography and wet etching as follows. First, photoresist (photosensitive resin) was applied on the SiO$_2$ film formed on the surface of the GaN film 2 to form a resist film. Then, UV was irradiated to the resist film through a exposure mask having a stripe pattern. Then, it was developed with a solvent to form a resist pattern. Using the resist pattern as an etching mask, the lower SiO$_2$ film was selectively etched by wet or dry etching. After the etching, the spent resist pattern was removed with stripper liquid or by ashing.

Thus, growth areas 3 were formed on the sapphire substrate. The growth areas 3 and the masks 4 were of a stripe shape with widths of 5 µm and 2 µm, respectively. The stripe direction was the <11–20> direction (FIG. 1(a)).

For the sapphire substrate with masks thus prepared, the SiO$_2$ surface of the striped masks was cleaned as follows just before being placed in a reaction tube.

First, the substrate was soaked in an organic solvent such as ethyl methyl ketone and ethanol, was subject to ultrasonic cleaning for 10 min or longer and then rinsed with extra pure water for 10 min or longer. Then, it was soaked in nitric acid at 80 to 100° C. for 30 min or longer, and then rinsed with extra pure water for 10 min or longer. Then, it was soaked in buffered hydrofluoric acid (ammonium fluoride+a buffer containing hydrofluoric acid) for 20 to 25 sec for etching the surface of the SiO$_2$ mask by about 1000 Å of thickness. Then, it was rinsed with extra pure water for about 10 min and dried under a stream of nitrogen. Then, the substrate was placed in a reaction tube of a crystal growing apparatus.

GaN crystals were grown on the growth areas 3 by a hydride VPE technique using gallium chloride (GaCl) as a Ga source, which was a reaction product of gallium (Ga) with hydrogen chloride (HCl), and ammonia gas (NH$_3$) as an N source. The substrate was placed in a growing apparatus and heated to a growth temperature of 1000° C. in an atmosphere of hydrogen. After the growth temperature became stable, HCl and NH$_3$ were supplied at flow rates of 20 cc/min and 1000 cc/min, respectively, for about 5 min to grow facets consisting of the {1–101} plane of a GaN crystal on the growth areas 3 (FIG. 1(b)). The epitaxial growth was continued for additional 20 min to grow the facets 6 until they covered the masks 4 (FIG. 1(c)).

The epitaxial growth was further continued to embed the facet structure (FIG. 1(d)). Finally, after growing for 5 hours in total, a GaN film 200 µm of thickness having a flat surface was formed (FIG. 1(e)). After forming the GaN crystal film 5, the substrate was cooled to room temperature while supplying ammonia gas and then removed from the growing apparatus.

It was observed that the GaN film 5 thus obtained had no cracks despite the fact that its lattice constant and coefficient of thermal expansion were different from those of the sapphire substrate 1.

TEM analysis of dislocations in a layer region near the surface of the crystal indicated that a density for dislocations having a displacement vector parallel to the c plane (Type-A dislocation) was significantly reduced, the proportion of Type-A dislocations became about 20% to overall dislocations in the layer region while the proportion of dislocations having a displacement vector tilted from the c plane (Type-B dislocation) became about 80%. An overall dislocation density in the layer region was reduced to about $1 \times 10^6/\text{cm}^2$. A dislocation density was determined by flat-plane observation near the film surface with a transmission electron microscope.

Since the GaN crystal film thus obtained had a very small number of defects, a high quality device structure such as a laser, an FET and an HBT may be fabricated on the film to improve device properties.

Although in this example a device was fabricated by growing crystals on the wafer of this invention, the process may be, of course, applied to a device using a wafer itself as a device operating region.

What is claimed is:

1. A GaN crystal film having a mask patterned in a stripe for forming multiple growing areas on a sapphire substrate and coalesced GaN crystals covering the mask dividing the areas, grown from the neighboring growing areas, comprising defects where multiple dislocations along with the stripe are substantially aligned with the normal line of the substrate, in the crystal areas over the mask and dislocations propagating in substantially parallel with the substrate surface while, in the vicinity of the areas where the crystals are coalesced over the mask, propagating substantially in the normal line of the substrate surface.

2. A GaN crystal film as claimed in claim 1 where the above dislocations propagating substantially in the normal line of the substrate surface have a displacement vector tilted with respect to the c plane of the GaN crystal and the above dislocations propagating substantially in the stripe direction have a displacement vector parallel to the c plane of the GaN crystal.

3. A GaN crystal film as claimed in claim 1 where in comparison with the layer region formed during an initial stage of the crystal growth, the upper layer has a lower ratio of the density of the dislocations having a displacement vector parallel to the c plane of the GaN crystal to the density of the dislocations having a displacement vector tilted from the c plane of the GaN crystal.

4. A GaN crystal film as claimed in claim 1 where the above defects are formed in the vicinity of both edges in the stripe direction on the mask and of the areas where the crystals are coalesced over the mask.

5. A GaN crystal film as claimed in claim 1 where a GaN-containing base crystal film is formed on the sapphire substrate, on which the masks are formed.

6. A GaN crystal film as claimed in claim 1 where the GaN crystal film formed on the sapphire substrate is formed by vapor-phase epitaxy.

7. A GaN crystal film as claimed in claim 1 where the sapphire substrate has been removed.

8. A semiconductor laser fabricated using the GaN crystal film as claimed in claim 1 or 7.

9. A GaN crystal film where at least 50% of the dislocations in the GaN crystal film have a displacement vector tilted from the c plane of the GaN crystal.

10. A GaN crystal film where less than 50% of the dislocations in the GaN crystal film have a displacement vector parallel to the c plane of the GaN crystal.

11. A GaN crystal film where at least 50% of the dislocations in the GaN crystal film have a displacement vector tilted from the c plane of the GaN crystal, while less than 50% of the dislocations in the GaN crystal film have a displacement vector parallel to the c plane of the GaN crystal.

12. A GaN crystal film as claimed in claim 11 where the dislocation density in the GaN crystal film is below $2 \times 10^8/\text{cm}^2$.

13. A semiconductor device fabricated using the GaN crystal film as claimed in claim 9, 10 or 11.

14. A semiconductor laser fabricated using the GaN crystal film as claimed in claim 9, 10 or 11.

15. A group III element nitride semiconductor wafer comprising a layer region where at least 50% of dislocations in the same layer region are those having a displacement vector tilted from the c plane of a wurtzite crystal structure.

16. A group III element nitride semiconductor wafer comprising a layer region where less than 50% of dislocations in the same layer region are those having a displacement vector parallel to the c plane of a wurtzite crystal structure.

17. A group III element nitride semiconductor wafer comprising a layer region where at least 50% of dislocations in the same layer region are those having a displacement vector tilted from the c plane of a wurtzite crystal structure while less than 50% of dislocations in the same layer region are those having a displacement vector parallel to the c plane.

18. A group III element nitride semiconductor wafer as claimed in claim 17 where the dislocation density in the layer region is below $2\times10^8/cm^2$.

19. A group III element nitride semiconductor wafer comprising a layer region where at least 60% of dislocations in the same layer region are those having a displacement vector tilted from the c plane of a wurtzite crystal structure.

20. A group III element nitride semiconductor wafer comprising a layer region where less than 40% of dislocations in the same layer region are those having a displacement vector parallel to the c plane of a wurtzite crystal structure.

21. A group III element nitride semiconductor wafer comprising a layer region where at least 60% of dislocations in the same layer region are those having a displacement vector tilted from the c plane of a wurtzite crystal structure while less than 40% of dislocations in the same layer region are those having a displacement vector parallel to the c plane.

22. A group III element nitride semiconductor wafer as claimed in claim 21 where the dislocation density in the layer region is below $1\times10^8/cm^2$.

23. A group III element nitride semiconductor wafer comprising a layer region where at least 70% of dislocations in the same layer region are those having a displacement vector tilted from the c plane of a wurtzite crystal structure.

24. A group III element nitride semiconductor wafer comprising a layer region where less than 30% of dislocations in the same layer region are those having a displacement vector parallel to the c plane of a wurtzite crystal structure.

25. A group III element nitride semiconductor wafer comprising a layer region where at least 70% of dislocations in the same layer region are those having a displacement vector tilted from the c plane of a wurtzite crystal structure while less than 30% of dislocations in the same layer region are those having a displacement vector parallel to the c plane.

26. A group III element nitride semiconductor wafer as claimed in claim 25 where the dislocation density in the layer region is below $5\times10^7/cm^2$.

27. A group III element nitride semiconductor wafer as claimed in any of claims 15 to 17, 19 to 21 and 23 to 25 comprising a layer region where a dislocation density in the wurtzite crystal structure almost monotonously decreases along one direction of the c axis.

28. A group III element nitride semiconductor wafer as claimed in any of claims 15 to 17, 19 to 21 and 23 to 25 where the layer region occupies the whole wafer.

29. A group III element nitride semiconductor wafer as claimed in any of claims 15 to 17, 19 to 21 and 23 to 25 where the crystal film having the layer region is formed on a hetero-substrate and is a crystal film having a mask patterned in a stripe for forming multiple growing areas on the hetero-substrate and coalesced crystals covering the mask dividing the areas, grown from the neighboring growing areas.

30. A group III element nitride semiconductor wafer as claimed in claim 29 where the hetero-substrate is a sapphire substrate.

31. A group III element nitride semiconductor wafer as claimed in any of claims 15 to 17, 19 to 21 and 23 to 25, one of whose main surfaces has a striped insulator.

32. A group III element nitride semiconductor wafer as claimed in any of claims 15 to 17, 19 to 21 and 23 to 25, one of whose main surfaces has a striped ethed pattern.

33. A group III element nitride semiconductor wafer as claimed in claim 29 where the stripe direction of the pattern is the <11–20> or <1–100> direction.

34. A group III element nitride semiconductor wafer as claimed in claim 31 where the stripe direction of the pattern is the <11–20> or <1–100> direction.

35. A group III element nitride semiconductor wafer as claimed in claim 32 where the stripe direction of the pattern is the <11–20> or <1–100> direction.

36. A group III element nitride semiconductor wafer as claimed in any of claims 15 to 17, 19 to 21 and 23 to 25 where the group III element nitride semiconductor is GaN.

37. A semiconductor device fabricated using the wafer as claimed in any of claims 15 to 17, 19 to 21 and 23 to 25.

38. A semiconductor laser fabricated using the wafer as claimed in any of claims 15 to 17, 19 to 21 and 23 to 25.

39. A semiconductor device where a device structure is fabricated on one of front and rear main surfaces of the wafer as claimed in claim 28, having a higher dislocation density.

40. A semiconductor laser where a device structure is fabricated on one of front and rear main surfaces of the wafer as claimed in claim 28, having a higher dislocation density.

41. A semiconductor device where a device structure is fabricated on the exposed surface of the wafer as claimed in claim 29 after removing its crystal region including the hetero-substrate and the masks.

42. A semiconductor laser where a device structure is fabricated on the exposed surface of the wafer as claimed in claim 29 after removing its crystal region including the hetero-substrate and the masks.

43. A process for manufacturing a group III element nitride semiconductor wafer, comprising forming a mask patterned in a stripe for forming multiple growing areas on a hetero-substrate made of a material different from crystals to be grown; cleaning the surface of the mask; growing crystals from the growing areas while forming facet structures to cover the mask by the crystals grown from the neighboring growing areas divided by the mask; and epitaxially growing crystals to embed the facet structures for flattening the surface.

44. A process for manufacturing a group III element nitride semiconductor wafer as claimed in claim 43 where the epitaxial growth is conducted by vapor-phase epitaxy.

45. A process for manufacturing a group III element nitride semiconductor wafer as claimed in claim 43 where the mask surface is cleaned by etching thereof.

46. A process for manufacturing a group III element nitride semiconductor wafer as claimed in claim 43 where the mask surface is cleaned by exposure to ozone or UV irradiation.

47. A process for manufacturing a group III element nitride semiconductor wafer as claimed in claim 43 where the mask surface is cleaned by heating it in a reducing atmosphere.

48. A process for manufacturing a group III element nitride semiconductor wafer as claimed in claim 43 where the stripe direction of the masks is the <11–20> or <1–100> direction.

49. A process for manufacturing a group III element nitride semiconductor wafer as claimed in claim 43 where a base crystal layer is formed on the hetero-substrate and the epitaxial growth is conducted on the base crystal layer.

50. A process for manufacturing a group III element nitride semiconductor wafer as claimed in claim 43 comprising thinning the hetero-substrate by grinding or polishing after the epitaxial growth.

51. A process for manufacturing a group III element nitride semiconductor wafer as claimed in claim 50 where the hetero-substrate is thinned to a thickness of below a half of that of the epitaxial growth layer.

52. A process for manufacturing a group III element nitride semiconductor wafer as claimed in claim 43 where the substrate used is a hetero-substrate with a thickness of below a half of the predetermined thickness of the epitaxial growth layer to be formed.

53. A process for manufacturing a group III element nitride semiconductor wafer as claimed in claim 50 or 52 comprising generating cracks on the hetero-substrate after the epitaxial growth.

54. A process for manufacturing a group III element nitride semiconductor wafer as claimed in claim 53 comprising soaking the hetero-substrate in a refrigerant to generate cracks thereon.

55. A process for manufacturing a group III element nitride semiconductor wafer as claimed in claim 51 or 52 comprising generating cracks on the hetero-substrate whose thickness is below a half of the epitaxial crystal layer and then removing the hetero-substrate by grinding or polishing.

56. A process for manufacturing a semiconductor wafer as claimed in claim 55 comprising forming a base crystal film on the hetero-substrate and then forming striped masks on the base crystal film, where the base crystal film is removed by grinding or polishing, together with the hetero-substrate.

57. A process for manufacturing a semiconductor wafer as claimed in claim 55 comprising removing the striped masks after or during removing the hetero-substrate by grinding or polishing after forming cracks.

58. A process for manufacturing a group III element nitride semiconductor wafer as claimed in claim 57 comprising flattening the crystal surface in the side where the striped masks have been removed.

59. A process for manufacturing a semiconductor device comprising forming a group III element nitride semiconductor wafer by the process as claimed in claim 58 and forming a device on the flattened surface in the side where the striped masks on the wafer have been removed.

60. A process for manufacturing a group III element nitride semiconductor wafer as claimed in claim 43 wherein the group III element nitride semiconductor is GaN.

61. A process for manufacturing a group III element nitride semiconductor wafer as claimed in claim 43 wherein the hetero-substrate is a sapphire substrate.

* * * * *